US012483207B2

(12) United States Patent
Schrögendorfer et al.

(10) Patent No.: US 12,483,207 B2
(45) Date of Patent: Nov. 25, 2025

(54) CIRCUITRY, CIRCUIT MODULE, SYSTEM AND METHOD FOR IMPEDANCE MATCHING AND SIGNAL ATTENUATION

(71) Applicant: Infineon Technologies AG, Neubiberg (DE)

(72) Inventors: Daniel Schrögendorfer, Linz (AT); Thomas Leitner, Pregarten (AT)

(73) Assignee: Infineon Technologies AG, Neubiberg (DE)

( * ) Notice: Subject to any disclaimer, the term of this patent is extended or adjusted under 35 U.S.C. 154(b) by 405 days.

(21) Appl. No.: 18/189,588

(22) Filed: Mar. 24, 2023

(65) Prior Publication Data

US 2023/0336131 A1 Oct. 19, 2023

(30) Foreign Application Priority Data

Apr. 19, 2022 (EP) ..................................... 22168883

(51) Int. Cl.
*H03F 1/32* (2006.01)
*H03F 1/26* (2006.01)
*H03F 3/195* (2006.01)

(52) U.S. Cl.
CPC ............... *H03F 3/195* (2013.01); *H03F 1/26* (2013.01); *H03F 2200/294* (2013.01); *H03F 2200/451* (2013.01)

(58) Field of Classification Search
CPC .................................. H03F 1/32; H03F 3/191
USPC ......................................... 330/149, 302, 305
See application file for complete search history.

(56) References Cited

U.S. PATENT DOCUMENTS

2003/0071697 A1 4/2003 Souetinov et al.
2015/0035595 A1 2/2015 Harwalkar et al.
2018/0198428 A1 7/2018 Hanafi et al.
2020/0382080 A1 12/2020 Seshita et al.

OTHER PUBLICATIONS

Schrögendorfer, Daniel, "Analysis and Design of a Broadband Output Stage With Current-Reuse and a Low Insertion-Loss Bypass Mode for CMOS RF Front-End LNAs", IEEE Transactions on Circuits and Systems—I: Regular Papers, vol. 68, No. 5, May 2021, 14 pages.

*Primary Examiner* — Henry Choe
(74) *Attorney, Agent, or Firm* — Slater Matsil, LLP

(57) ABSTRACT

In accordance with an embodiment, a system includes a switchable resistive element configured to be coupled to an input of an RF amplifier, and a switchable capacitive element having a first terminal configured to be coupled between the switchable resistive element and inductive element coupled to a system input. The switchable capacitive element is configured to reduce a first impedance of the inductive element to a second impedance lower than the first impedance during a first operation mode; the switchable resistive element is configured to reduce an input impedance of the RF amplifier to a third impedance lower than the input impedance of the RF amplifier during the first operation mode; and the switchable capacitive element and the switchable resistive element are configured to provide a first attenuation to an RF signal provided at the system input during the first operation mode.

20 Claims, 15 Drawing Sheets

CIRCUITRY, CIRCUIT MODULE, SYSTEM AND METHOD FOR IMPEDANCE MATCHING AND SIGNAL ATTENUATION

This application claims the benefit of European Patent Application No. 22168883, filed on Apr. 19, 2022, which application is hereby incorporated herein by reference.

TECHNICAL FIELD

Embodiments of the disclosure are related to a circuitry, a circuit module, a system and a method for impedance matching and signal attenuation.

BACKGROUND

Recent RF front-end (RFFE) low-noise amplifier, LNA, blocks (see e.g., FIG. 13) for mobile communication devices are mainly LNAs with an external matching component and a common-source input stage to achieve a low noise figure (NF) with a high gain performance.

FIG. 13 shows an example for an RFFE LNA with external matching inductor. FIG. 13 shows an input $RF_{in}$ for a radio frequency, RF signal, an inductive matching element in the form of an OFF-chip matching component (also referred to as external matching inductor) coupled with the input $RF_{in}$ and with an input $RF_{inLNA}$ of an amplifier, in the form of a low-noise amplifier, LNA, the LNA being coupled with a signal output $RF_{out}$.

These LNAs may support the so-called "linearity on demand" feature, which involves the implementation of different gain modes. Some of these modes are called active gain-steps e.g. with no (−3 dB to 0 dB) or low (3 dB to 6 dB) power gain, and high linearity requirements. In addition, the NF performance may, for example, be less critical in these modes.

These RFFE LNAs can be placed as a standalone device or as a complex monolithic integrated circuit with acoustic bandpass filters such as Surface Acoustic Wave, SAW, or bulk acoustic wave, BAW, filters and external matching inductors (also called RF front-end module).

Due to the reason that modern RFFE mobile communication modules have a high complexity because of the high amount of different frequency bands (see e.g. FIG. 16), it may be advantageous that LNA cores support a wide range of frequency bands to reduce developing cycles and also circuit design effort. Therefore, novel LNA circuitries may have to perform in different frequency bands with ultra-low RF-performance variation.

FIG. 16 shows an example for a single LNA block (left) and for a LNA block on a complex monolithic RFFE module (right). The single LNA block (left) comprises an input $RF_{inBX}$, coupled with an acoustic filter. Between the acoustic filter and a controllable LNA comprising a control logic, an inductive matching element in the form of an OFF-chip matching component is arranged, which is coupled with the filter and an input $RF_{inx}$ of the LNA. The output of the LNA is coupled with an output $RF_{outx}$. The complex monolithic RFFE module (right) comprises a controllable LNA with a plurality of inputs, all coupled with respective filters, matching elements and inputs (e.g., such that $x \in \{1, 2, 3, 4, 5\}$).

There are several ways to reduce the gain in order to improve the linearity performance and there is no common solution for all applications. For active gain modes between −3 dB to 6 dB the input signal in front of the LNA may be attenuated increase linearity.

One way to implement such an attenuation is to use a no/low-gain function with pre-attenuator before matching inductor as shown in FIG. 14, which illustrates an example of a LNA with a pre-attenuator before the external matching inductor. As shown in FIG. 14, a parallel circuit comprising a shunt-switch and an attenuator may be coupled with an input $RF_{in}$ and a matching inductor (OFF-Chip Matching) as an example of an inductive matching element. The matching element is coupled with an LNA, which is coupled with an output $RF_{out}$.

This method may be a simple, or even the simplest way to implement a low-gain functionality with high linearity. The RF signal gets reduced in a 50 Ohm environment with a pre-attenuator before the LNA matching.

The drawbacks of this implementation are an additional loss before the LNA circuit leads to increased NF, and the use of additional external pins to connect the matching inductor (chip size; e.g. the need for additional chip area in order to implement the additional external pins).

Another way to implement such an attenuation is to have no/low gain functionality with pre-attenuator after matching inductor, as shown in FIG. 15, which illustrates an example of an LNA with pre-attenuator after the external matching inductor. Compared to FIG. 14, the shunt switch and the attenuator are arranged between the inductive matching element and the LNA.

In many cases, it may not be possible to implement the solution with a pre-attenuator in a 5*o* Ohm environment (see e.g., FIG. 14). In addition, an attenuator after the LNA cannot be used because the linearity performance will not improve (reduced gain but no improved linearity performance). Another possibility to reduce the power gain is the implementation of an attenuator after the off-chip matching where a high-ohmic environment is given. The attenuator sees on the one side to $RF_{IN}$ a high-ohmic inductive impedance and on the other side to the LNA input a high-ohmic capacitive impedance, which also has a high variation over frequency and results in a high gain variation for multiple frequency bands (e.g., gain variation more than 3 dB depending on frequency range). In addition, additional input parasitics may be significant and may reduce the LNA RF-performance in all other gain-modes (off-capacitance of the attenuator).

Therefore, there is a need to provide a concept for a gain functionality with high linearity, which makes a better compromise between signal linearity, noise figure, chip space, efficiency and cost.

SUMMARY

Embodiments according to the disclosure comprise a circuit for a radio frequency front end, RFFE, the circuitry comprising a signal input to be coupled to an inductive matching element of the RFFE, the inductive matching element having a high ohmic output impedance for a radio frequency (RF) signal, a signal output to be coupled to an input of an amplifier of the RFFE, the input of the amplifier having a high ohmic input impedance for the RF signal, a reference output to be coupled to a reference potential, a first switchable element, being a capacitive element coupled between the signal input and the signal output when the circuitry is in a first operating mode and a second switchable element, being a resistive element coupled between the signal output and the reference output when the circuitry is in the first operating mode.

Furthermore, the first switchable element is configured to convert the high ohmic output impedance of the inductive matching element to a low ohmic impedance at an output of the first switchable element when the circuitry is in the first operating mode, and the second switchable element is configured to match the high ohmic input impedance of the amplifier at the signal output to the low ohmic impedance at the output of the first switchable element and to attenuate the RF signal provided from the inductive matching element to the amplifier, when the circuitry is in the first operating mode.

The inventors of the embodiments as described in the present disclosure have recognized that using circuitry comprising a first and second switchable element, an impedance matching and attenuation for an RF signal for an amplifier of an RFFE may be provided efficiently. Therefore, the first switchable element may, for example, operate as, or act as, or represent or may, for example, be a capacitive element in the first operating mode. The second switchable element may, for example, operate as, or act as, or represent, or may, for example, be a resistive element in the first operating mode.

Therefore, the switchable elements may, for example, be switchable between different operating modes. As an example, in the first operating mode of the circuitry, the first switchable element may be switched to a capacitive operating mode and the second switchable circuitry may be switched to a resistive operating mode.

Optionally, the switchable elements may, for example, be switched to a second operating mode, different from the first operating mode of the circuitry or may, for example, be turned off. As an example, the switchable elements may be configured to minimize an influence of the respective switchable element on the RF signal in such a second operating mode, or turned off state.

As an example, the circuitry may be set to the first operating mode, such that the first switchable element influences the RF signal at least approximately or at least substantially like a capacitor and such that the second switchable element influences the RF signal at least approximately or at least substantially like a resistor.

As an example, the first switchable element may be configured to couple a capacitive element between the signal input and the signal output in the first operating mode and to uncouple the capacitive element in the second, optional, operation mode. Accordingly, the second switchable element may be configured to couple a resistive element between the signal output and the reference output in the first operating mode and to uncouple the resistive element in the second, optional, operation mode. Coupling and uncoupling may, for example, be understood as opening or closing a switch, such that an influence of a respective element controlled by the switch may come in to effect, e.g. in the first operating mode, and such that only parasitic influences may come into effect, e.g. in a second operating mode.

As an example, the capacitive behavior of the first switchable element may provide an impedance transformation from the output of the inductive matching element to a low ohmic impedance at the output of the first switchable element. Optionally, the resistive behavior of the second switchable element may provide an impedance transformation from the low ohmic impedance at the output of the first switchable element to the high ohmic input impedance of the amplifier. Furthermore, the resistive behavior of the second switchable element may allow for an attenuation of a respective RF signal provided from the inductive matching element to the amplifier. Furthermore, this attenuation may be performed in a low ohmic environment, because of the impedance transformations, which may improve the linearity and/or noise figure characteristics of the RF signal.

This may allow providing an active gain of the RF signal with high linearity. As an example, in order to provide a desired attenuation of such an RF signal, the second switchable element may be coupled with the first switchable element, in order to provide a voltage divider for the RF signal provided from the first switchable element.

Further embodiments of the disclosure comprise a method for impedance matching and signal attenuation, the method comprising providing a radio frequency (RF) signal to a signal input of a circuitry, wherein the signal input is coupled to an inductive matching element of a radio frequency front end, RFFE, the inductive matching element having a high ohmic output impedance for the RF signal.

The method further comprises forwarding, in a first operating mode of the circuitry, the RF signal to a first switchable element, the first switchable element being a capacitive element coupled between the signal input and a signal output of the circuitry and to a second switchable element, the second switchable element being a resistive element, coupled between the signal output and a reference output of the circuitry.

Furthermore, the signal output is coupled to an input of an amplifier of the RFFE, the input of the amplifier having a high ohmic input impedance for the RF signal, and the reference output is coupled to a reference potential.

The method further comprises converting, in the first operating mode using the first switchable element, the high ohmic output impedance of the inductive matching element to a low ohmic impedance at an output of the first switchable element and matching, in the first operating mode using the second switchable element, the high ohmic input impedance of the amplifier at the signal output to the low ohmic impedance at the output of the first switchable element and attenuating the radio frequency (RF) signal provided from the inductive matching element to the amplifier.

The method as described above is based on the same considerations as the above-described circuitry. The method can, by the way, be completed with all features and functionalities, which are also described with regard to the circuitry.

BRIEF DESCRIPTION OF THE DRAWINGS

The drawings are not necessarily to scale, emphasis instead generally being placed upon illustrating the principles of embodiments of the disclosure. In the following description, various embodiments of the disclosure are described with reference to the following drawings, in which.

DETAILED DESCRIPTION OF ILLUSTRATIVE EMBODIMENTS

Figure 1:
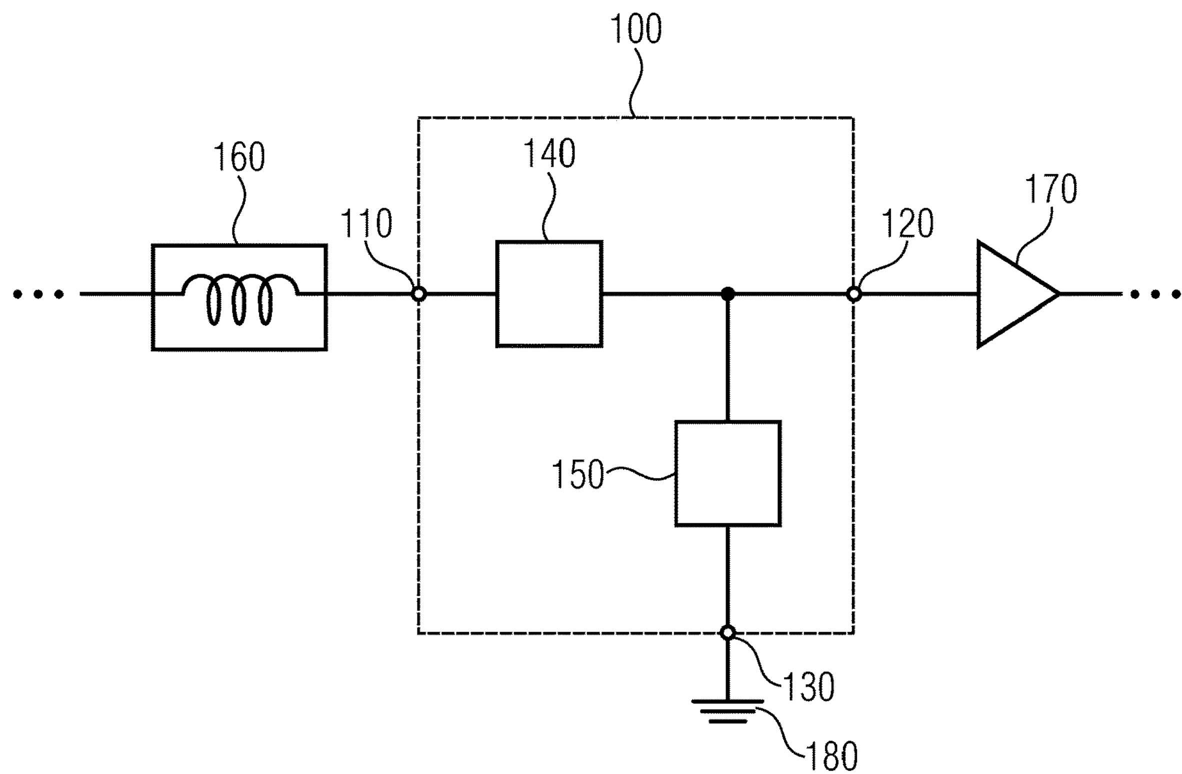
FIG. 1 shows a schematic view of a circuitry according to embodiments of the disclosure.

Equal or equivalent elements or elements with equal or equivalent functionality are denoted in the following description by equal or equivalent reference numerals even if occurring in different figures.

In the following description, a plurality of details is set forth to provide a more throughout explanation of embodiments of the present disclosure. However, it will be apparent to those skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described herein after may be combined with each other, unless specifically noted otherwise.

FIG. 1 shows a schematic view of a circuitry according to embodiments of the disclosure. FIG. 1 shows circuitry 100 comprising a signal input no, a signal output 120 and a reference output 13*o*. The circuitry 100 further comprises a first switchable element 140 coupled between the signal input no and the signal output 120 and a second switchable element 150 coupled between the signal output 120 and the reference output 130.

As optionally shown in FIG. 1 the second switchable element 150 may hence be coupled between the first switchable element 140 and the reference output 13*o*. As another optional feature, the signal input no is coupled with an inductive matching element 160 e.g. a matching inductor; e.g. an off-chip matching inductor. As further examples, the signal output 120 is coupled with an amplifier 170, e.g. a low noise amplifier, and the reference output 130 is coupled to a reference potential 18*o*, e.g. earth.

As explained before, the circuitry may, for example, be used for a radio frequency front end, RFFE. As an example, an RF signal may be provided via the inductive matching element 160, which may be a part of the RFFE, to the signal input no. Originating from the signal input no, the inductive matching element may comprise a high ohmic output impedance.

As an example, in general, a high ohmic impedance may be an impedance significantly higher than 50Ω; e.g. an impedance at least 10 times higher than 50Ω or at least 100 times higher than 50Ω or at least 1000 times higher than 50Ω or at least 10000 times higher than 50Ω.

The first switchable element 140 may be or may represent or may act as or may operate as a capacitive element, for the RF signal, in a first operating mode of the circuitry 100, and may hence, as an example, convert the high ohmic output impedance of the inductive matching element 160 to a low ohmic impedance at an output of the first switchable element 140.

As an example, in general, a low ohmic impedance may be a 50Ω impedance (e.g., with a tolerance of +/−1% or +/−5% or +/−10% or +/−50%), e.g. approximately or substantially a 50Ω impedance; e.g. an impedance of at least ion and at most 9052, e.g. an impedance significantly, e.g. at least by a factor of 10 or 100 or 1000 or 1000, lower than the high ohmic impedance.

Hence, as an example, the circuitry may provide a low ohmic environment for the RF signal at the output of the first switchable element 140 in the first operating mode.

The optional coupling of the second switchable element 150, being or operating as, or acting as, or representing a resistive element, between the output of the first switchable element 140, the output 120 and the reference output 130, in the first operating mode, may allow to attenuate the RF signal. As an example, the circuitry 100 may act as a voltage divider for the RF signal.

Furthermore, in the first operating mode, the second switchable element 150 may match, e.g. substantially, or approximately, a high ohmic input impedance of the amplifier 170 at the signal output 120 to the low ohmic impedance at the output of the first switchable element 140.

Hence, the circuitry 100 may achieve an impedance matching and a signal attenuation. This may allow providing a no gain or low gain signal amplification with high linearity in the first operating mode. Here, it is to be noted that since the first and second switchable elements 140, 150 are switchable, the circuitry 100 may be reconfigured, e.g. in a second operating mode, in order to provide another gain functionality.

Hence, a low complexity circuitry may be provided that allows increasing the flexibility of an RFFE comprising an inductive matching element 160 and an amplifier 170. As an example, the circuitry 100 may be configured, e.g. in a second operating mode, e.g. a high gain operating mode, to minimize an influence of the switchable elements 140 and 150 on the RF signal, such that a high ohmic output impedance of inductive matching element 160 may be matched with a high ohmic input impedance of amplifier 170, e.g. in order to realize a high gain mode, with lower requirements with respect to linearity.

The inventors recognized that using circuitry 100 switchable elements 140 and 150 allow switching between different gain modes of an RFFE fulfilling different requirements with respect to linearity.

In other words, the fundamental idea according to embodiments is to use a second switchable element iso, for example a shunt resistor, to achieve a low ohmic input impedance, e.g. a 50 Ohm input impedance, for a high-ohmic input stage of an amplifier 170, e.g. a LNA. At the same time, it may act as attenuation (e.g. depending on the resistor value). In addition, the first switchable element 140, for example a switchable capacitance, in series with the inductive matching element 160, (e.g. an off-chip matching element) may be used to enable a low ohmic environment, e.g. a 50 Ohm environment after the inductive matching element (for example, providing an inductor-compensation).

Optionally, the first switchable element 140 may be a single transistor, a parallel circuit of a capacitor and a transistor and/or a PIN diode. Furthermore, a respective transistor or diode of the first switchable element 140 may be configured to be switched in an off state in the first operating mode and in an on state in a second operating mode.

As an example, in the case of the single transistor, in the first operating mode, the transistor may be switched off, such that the transistor acts or operates only as a capacitance of an open switch. This capacitance, e.g. COFF may allow an impedance shift from the high output impedance of the inductive matching element 160 towards a low ohmic impedance. Hence, the transistor may be configured to perform such an impedance transformation in its off state. On the other hand, in an on state of the transistor an RF signal provided from the inductive matching element 160 may pass the transistor approximately unhindered, e.g. with only minor ohmic losses, e.g. with the transistor having a low resistance RON. The PIN diode may comprise an analogous functionality. A transistor may, for example, be a MOS transistor or e.g. a bipolar transistor.

In the example of the parallel circuit of the transistor and the capacitor, the transistor may act as coupling element for the capacitor. In the first operating mode, the transistor may act as open switch, e.g. in a turned off state of the transistor, such that the capacitance (and for example a parasitic capacitance of the transistor operating as open switch) may affect the RF signal. In an optional second operating mode, e.g. with the transistor in an on state, the capacitance may be bypassed by the low ohmic signal path through the transistor. Hence, effectively, the capacitance may be uncoupled from the circuitry 100.

Optionally, the second switchable element 150 may comprise a series circuit comprising a resistive element and a switch, and the switch may be configured to couple the resistive element between the signal output 120 and the reference output 130 when the circuitry 100 is in the first operating mode and to uncouple the resistive element between the signal output and the reference output when the circuitry is in a second operating mode.

It is to be noted the uncoupling of the resistive element may, for example, be understood as a substantial or approximate uncoupling, since a switch may always comprise a certain capacitive coupling, when the switch is open. However, in the second operating mode, the resistive element may, for example, have no substantial influence on the RF signal provided from the inductive matching element 160 to the amplifier 170.

As an example, the second switchable element 150 may comprise a switchable shunt resistor, e.g. RSH, and the parasitic capacitance of the switch in an open state may be low. The resistance value of the resistive element, and for example hence the shunt resistor, may be chosen in accord with a desired impedance matching between amplifier and first switchable element and signal attenuation.

Figure 2:
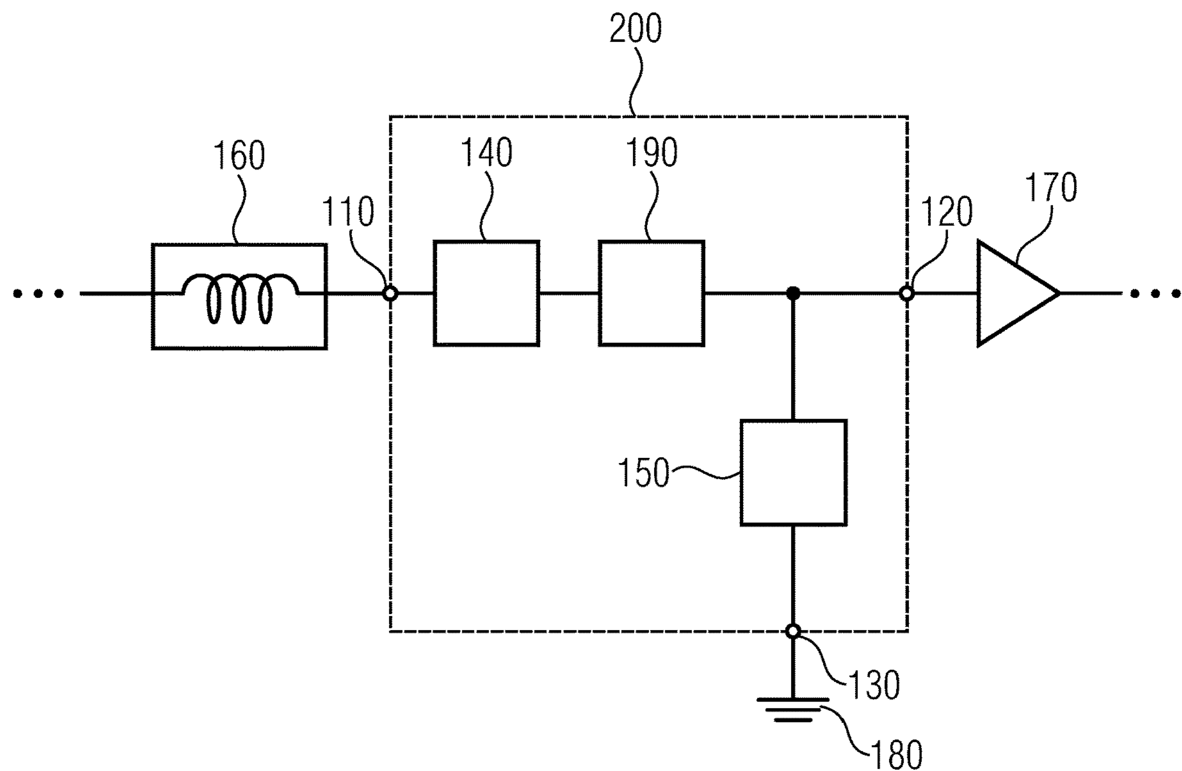
FIG. 2 shows a schematic view of a circuitry comprising a further switchable element according to embodiments of the disclosure.

FIG. 2 shows a schematic view of a circuitry comprising a further switchable element according to embodiments of the disclosure. FIG. 2 shows circuitry 200 comprising, apart from elements as explained in the context of FIG. 1, a further switchable element 190 wherein the further switchable element 190 is a resistor coupled between the signal input no and the signal output 120, when the circuitry 200 is in the first operating mode, in order to further attenuate the RF signal and in order to improve the output matching.

The inventors recognized that in some cases a higher ohmic impedance may be needed between the signal input no and the signal output 120 in order to attenuate an RF signal provided from the inductive matching element 160 to the amplifier 170. As explained before, with the further element being switchable, an influence on the resistive element, may be reduced or mitigated, e.g. in a second operating mode of the circuitry 200. Furthermore, the further resistive element may only be optionally activated on the first operating mode, e.g. such that in the first operating mode, a first attenuation may be provided, when the further switchable element 190 operates or is the resistor, and a second attenuation may be provided, when a resistive influence, or behavior of further switchable element 190 is at least approximately disabled.

Figure 3A:
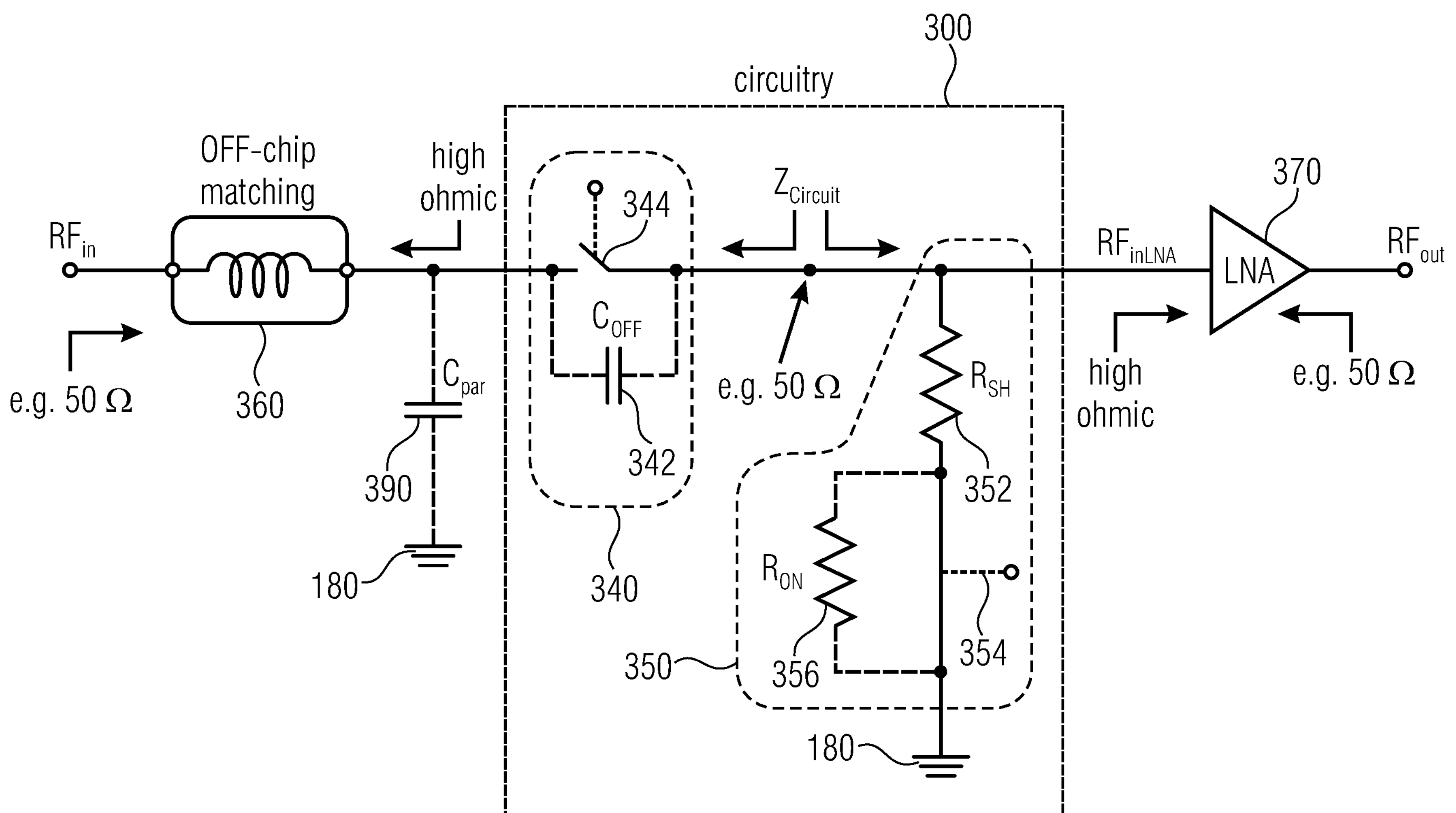
FIGS. 3*a* and 3*b* show schematic views of a circuitry in a first operating mode (a) and in a second operating mode (b) according to embodiments of the disclosure.
Figure 3B:
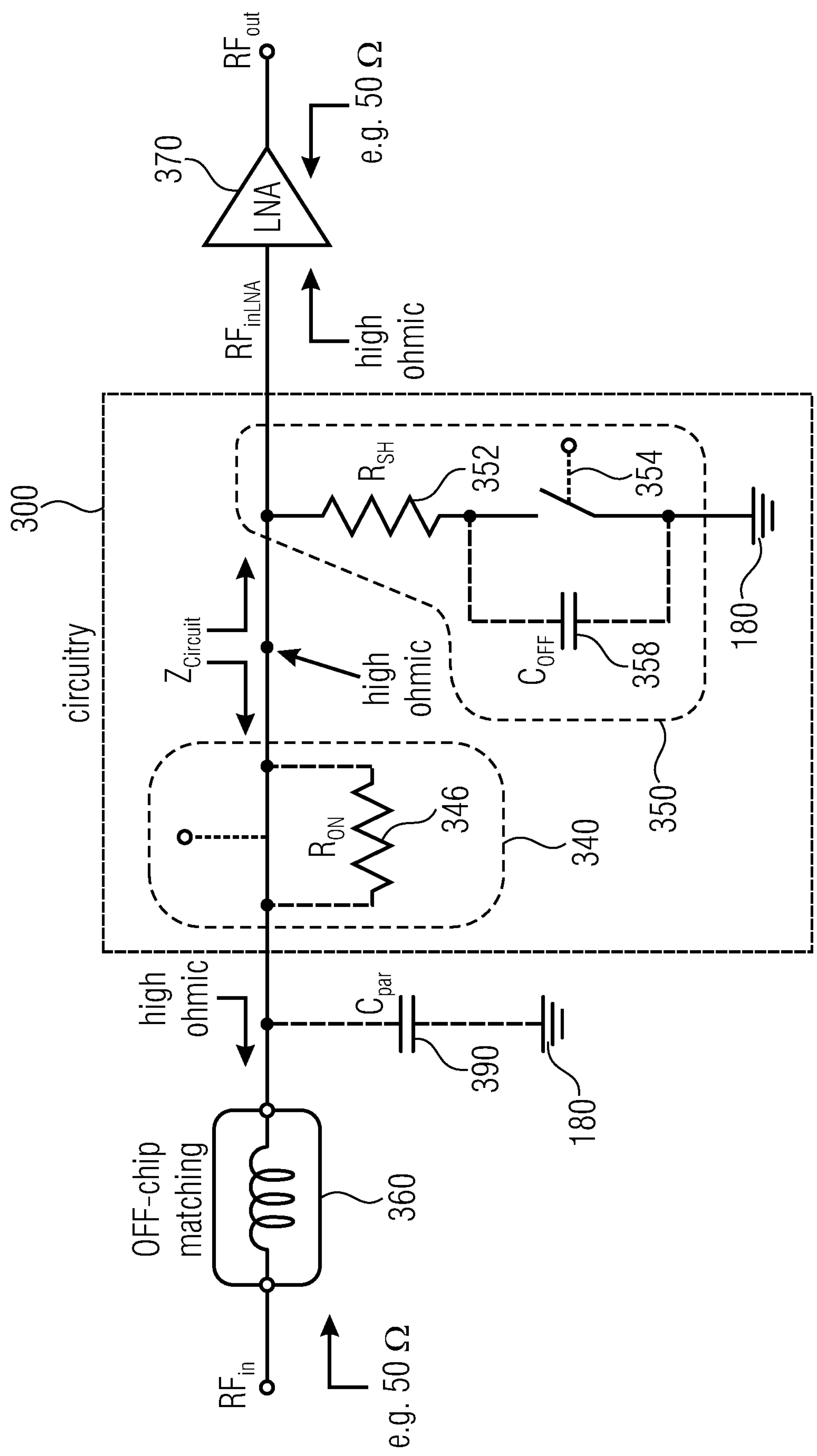

FIGS. 3*a* and 3*b* show schematic views of a circuitry in a first operating mode (a) and in a second operating mode (b) according to embodiments of the disclosure. FIGS. 3*a* and 3*b* show circuitry 300 comprising a first switchable element 340, coupled between a signal input (not explicitly shown) and a signal output (not explicitly shown) of the circuitry, and a second switchable element 350, coupled between the signal output and the reference output (not explicitly shown). The reference output is coupled with earth 180. As an example, input impedances and output impedances are highlighted with an arrow and a remark (50*c*2, high ohmic). It is to be noted that 50Ω as shown in FIGS. 3*a* and 3*b* is one example of a low ohmic impedance, such that embodiments are not limited to a specific impedance value.

As shown, optionally, the output of the circuitry may be coupled with an amplifier 370, e.g. a LNA having an input $RF_{inLNA}$. The amplifier 370 may be coupled with an output $RF_{out}$ Furthermore, the input of the circuitry 300 may be coupled, as shown, with an inductive matching element 360, e.g. in the form of an OFF-Chip Matching Module. An RF signal may be provided to the inductive coupling element via input $RF_{in}$.

Furthermore, a capacitance $C_{par}$ 390, coupled with the inductive matching element 360, the input of the circuitry and earth 180, is shown. Capacitance 390 may represent input parasitics, e.g. caused by a phase shift of the RF-line between inductive matching element 360 and an input pad of the amplifier, e.g. an LNA input pad, and/or by a metal area of the pad and/or by electrostatic discharge, ESD, protections circuits.

As an example, the first switchable element 340 in FIG. 3 may be a transistor. In the first operating mode of the circuitry, see FIG. 3*a*, the transistor may represent or may act as or may operate as an open switch 344, such that substantially, only a capacitance $C_{OFF}$ (as shown as capacitor 342) may affect an RF signal provided to the circuitry 300. In other words, in the first operating mode, effectively capacitor 342 may be coupled between the signal input and the signal output. However, the first switchable element 340 may as well be a parallel circuit of a switch (e.g. element 344) and a capacitor with capacitance $C_{OFF}$ (e.g. 342).

Capacitance $C_{OFF}$ may be chosen such that the high ohmic output impedance of the inductive matching element 360 may be converted to a low ohmic impedance. As an example, the high ohmic impedance may be converted to a 5012 impedance.

Optionally, the first switchable element 340 may be configured to provide a series resonator with the inductive matching element 360 and the input parasitic capacitance 390, in order to convert the high ohmic output impedance of the inductive matching element 360 to the low ohmic impedance. In other words, the inventors recognized that an influence of parasitic effects, as explained above, might as well be taken in consideration when implementing capacitance $C_{OFF}$, for providing a good impedance matching.

Furthermore, optionally, as shown, the second switchable element 350 may comprise a series circuit comprising the resistive element $R_{SH}$ 352 and a switch 354. The second switchable element 350 may, for example, be a shunt resistor, e.g. a resistor $R_{SH}$, shunted by switch 354. As shown, the switch 354 may be configured to couple the resistive element $R_{SH}$ 352 between the signal output and the reference output when the circuitry is in the first operating mode. Hence, in the first operating mode, the switch may be closed, such that resistive element $R_{SH}$ 352 is coupled between the signal output and the reference output. In this state, the switch may affect the circuitry 300 with its own ohmic resistance $R_{ON}$ 356. As an example, $R_{ON}$ 356 may be a low ohmic resistance. For example, switch 354 may be a transistor, having resistance $R_{ON}$ in an on state, e.g. when operating as a closed switch.

Hence, in the first operating mode, a resistive element, e.g. $R_{SH}$ 352 or respectively the combination $R_{SH}$+$R_{ON}$ may be coupled between the signal output and the reference output, in order to match the high ohmic input impedance of the amplifier 370 at the signal output to the low ohmic impedance, e.g. as shown 50Ω, at the output of the first switchable element 340 and to attenuate a radio frequency (RF) signal provided from the inductive matching element 360 to the amplifier, when the circuitry is in the first operating mode.

As an example, in FIG. 3*b* an optional second operating mode of the circuitry is shown. In the second operating mode, the first switchable element 340 may operate as a closed switch. Hence, the first switchable element 340 may affect the circuitry 300 only in a minor way with an intrinsic ohmic resistance $R_{ON}$, as represented with resistance 346. Hence, this may be interpretable as capacitance $C_{OFF}$ 342 being uncoupled between signal input and signal output of circuitry 300.

In the second operating mode, the second switchable element 350 may be configured, e.g. using switch 354 to substantially uncouple the resistive element $R_{SH}$ 352 from the reference output. Consequently, switch 354 may affect circuitry 300 only in a minor way by its e.g. low capacitance $C_{OFF}$ 358. Yet, this may be interpreted as $R_{SH}$ being uncoupled.

It is to be noted, that $R_{ON}$ 346 of the first switchable element 340 and $R_{ON}$ 356 of the second switchable element may be different. This applies similarly for the capacitances $C_{OFF}$ 342 and 358. Especially capacitance $C_{OFF}$ 342 may be chosen in accord with the inductive matching element 360, for example having an inductance $L_G$, and optionally parasitic effects, e.g. as represented by capacitance $C_{par}$ 390, in order to provide a good impedance matching, e.g. to a low ohmic (e.g. 50Ω) environment. Contrarily, as an example, capacitance $C_{OFF}$ 358 may be implemented as a low capacitance, such that its influence on circuitry 300 is very small, e.g. as small as possible.

In general, it is to be noted that a focus of some embodiments may be the input matching ($S_{11}$) and the power gain ($G_{MAX}$, $S_{21}$) performance and not, or less, the output matching ($S_{22}$), wherein Sab may be a respective scattering parameter, or S-parameter of a circuitry according to an embodiment. As an example, the assumption may be made that $S_{22}$ is broadband or switchable and therefore matched for different frequency bands.

In the following further embodiments of the disclosure will be described in the context of FIGS. 3*a* and 3*b*.

Figure 14:
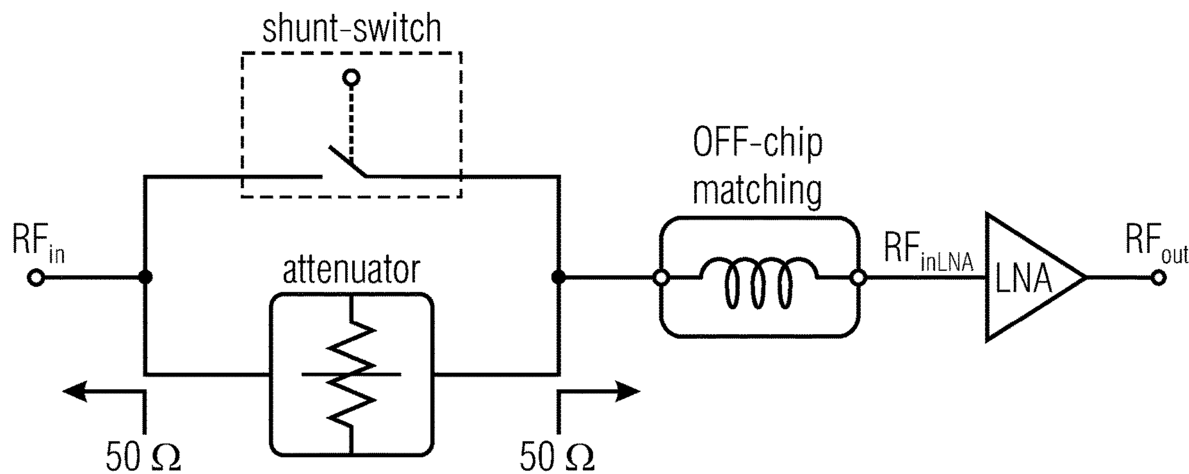
FIG. 14 shows an example of a LNA with a pre-attenuator before the external matching inductor.
Figure 15:
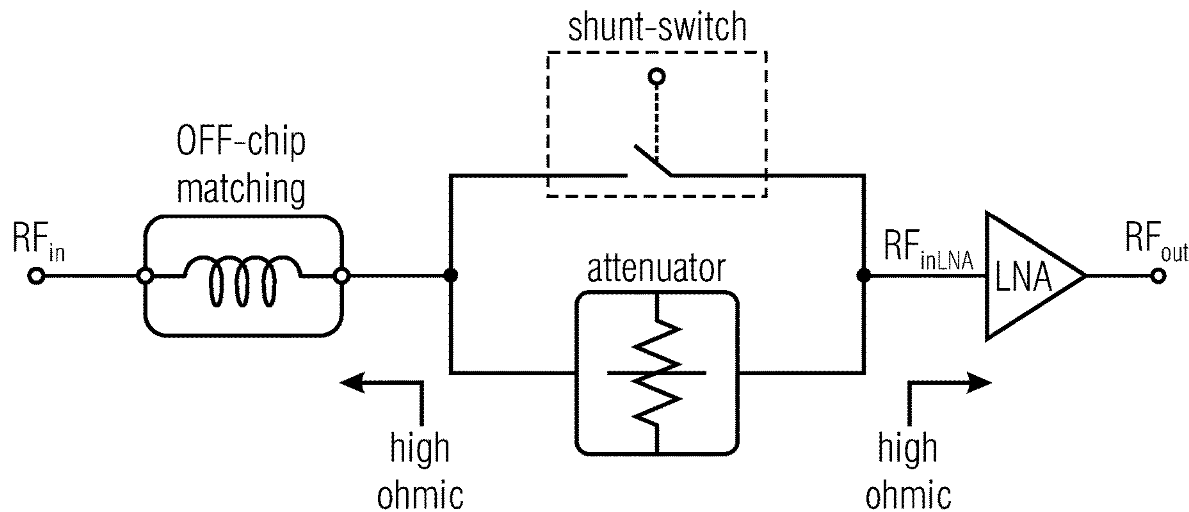
FIG. 15 shows an example of an LNA with pre-attenuator after the external matching inductor.
Figure 16:
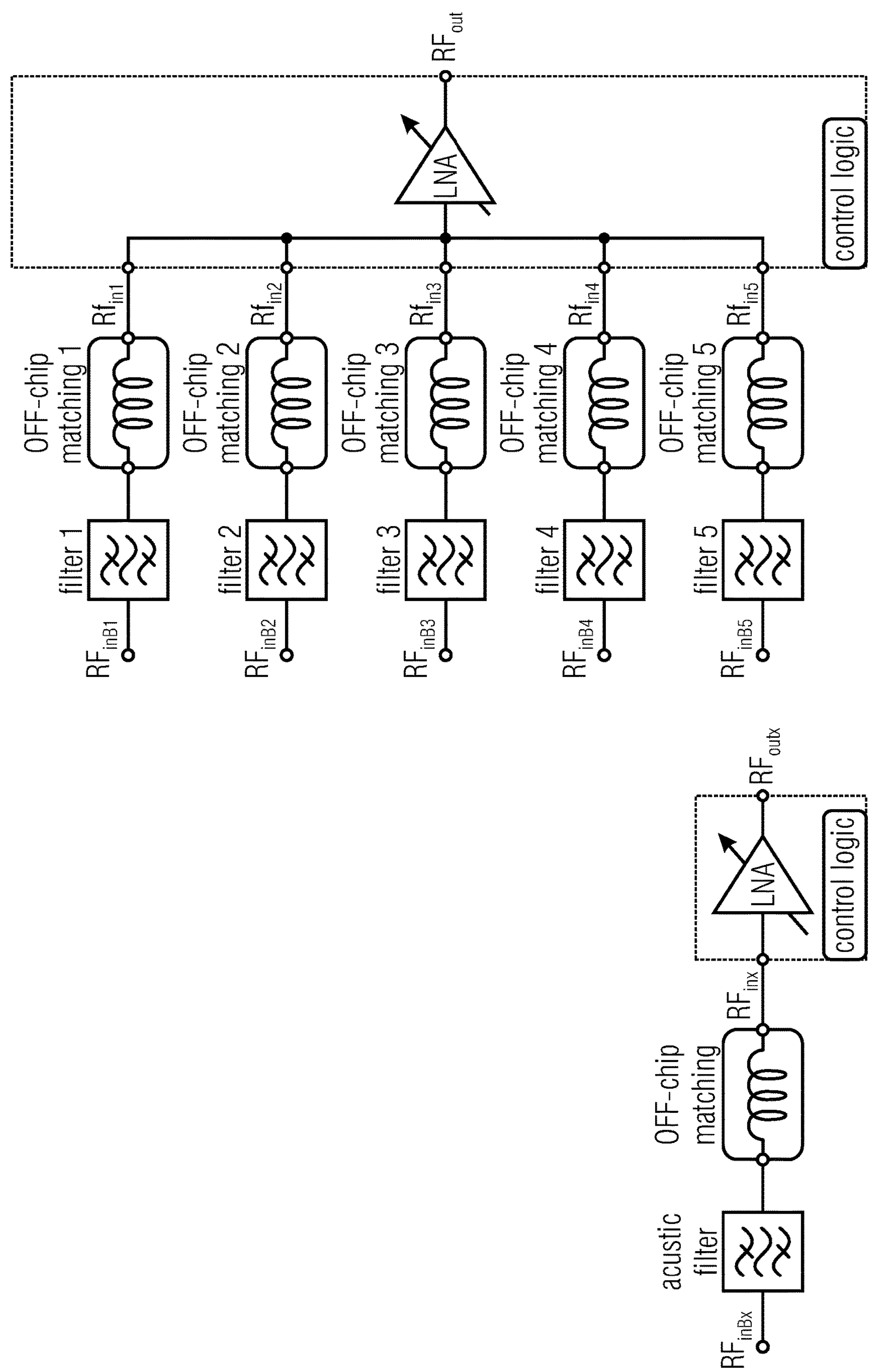
FIG. 16 shows an example for a single LNA block (left) and for a LNA block on a complex monolithic RFFE module (right).

According to embodiments, advantages of approaches as explained in the context of FIGS. 14 and 15 may be combined, e.g. synergistically. As an example, a simple implementation, for example well or even perfectly suited for multiple-input LNAs, optionally, with a constant attenuation over frequency may be provided. A low ohmic environment, e.g. a 50 Ohm environment after the matching inductor, e.g. 360, by minimized chip size (e.g. no additional extra pin required) may be achieved (see e.g. FIG. 3*a*). Hence, as an example, a low ohmic environment, e.g. for impedance matching and/or signal attenuation, may be provided without increasing the chip area used for the circuitry. Embodiments, e.g. as shown in FIG. 3*a*, may enable a reduced complexity compared to approaches as shown in FIGS. 14 and 15, for example, due to no need of a complex switchable pre-attenuator. The pre-attenuation may be constituted by a simple switchable shunt resistor $R_{SH}$, e.g. 352, which may also match the Si, of the LNA input, e.g. $RF_{inLNA}$, to 50 Ohm. Therefore, an ultra-low gain-deviation over multiple frequency bands and minimized input parasitics (e.g. with no need of a switchable pre-attenuator) for, for example all other, gain modes may be achieved. $R_{SH}$ with $R_S$ (source impedance of 50 Ohm) may create a simple voltage divider at the LNA input, which may reduce the input voltage by $R_{SH}/(R_{SH}+R_S)$. Depending on $R_{SH}$, the wanted attenuation in front of the LNA can be set. Hence, FIG. 3*a* may show circuitry 300 in an enabled state.

Functionality in high-gain mode (e.g., circuitry disabled): FIG. 3*b* may show an example of the circuitry 300 in a second operating mode, e.g. in a high-gain (HG) mode (In this mode, the circuitry 300 may be disabled). The first switchable element, e.g. in the form of a switchable capacitor may be switched-on as RF-switch in the HG mode. Wide switches may, for example, be necessary to reduce a noise contribution of the RON. This switch may be implemented as low-ohmic and/or low-capacitive device, for example, like a MOS-transistor or a PIN-diode. The shunt-resistor switch may be set to open in the HG mode and may be implemented with small width to minimize parasitics in this gain mode. The input stage of the LNA may be a NMOS Transistor with source degeneration and it may be matched to 50Ω with the external matching inductor 360. The circuit principle is also applicable for Bipolar LNAs. As an example, LNA 370 may hence be a bipolar LNA.

In the following, referring to FIGS. 3*a* and 3*b*, examples for the implementation of the first switchable element 340, also referred to as a pre-Switch herein, according to embodiments are disclosed.

According to an embodiment, the design of the Pre-Switch may be implemented as follows.

A low on resistance $R_{ON}$ may, for example, be used to minimize the NF impact for the HG modes. As an example, according to embodiments, $R_{ON}$ may be implemented as a low ohmic resistance, such that in a second operating mode, an influence on circuitry 300 is kept minimal. Such a mode may be a high gain mode, wherein linearity requirements are less strict than in the first operating mode. As an example, transistor widths larger 1 mm may affect the HG modes by less than 0.03 dB NF. Hence, the first switchable element 340 may comprise transistors with large widths, e.g. with widths larger than 1 mm, e.g. with widths between 0.9 mm and 1.1 mm or for example with widths larger than 1 mm and less than 5 mm.

The off capacitance $C_{OFF}$ may, for example, be used to implement a series resonator in the low-gain modes, e.g. a first and/or third operating mode, and to compensate the external matching inductor 160. It can, for example, be implemented as a single transistor or as a parallel circuit of a capacitor and a transistor. Hence, the first switchable element 340 may comprise or may even be a single transistor and/or a parallel circuit of a capacitor and a transistor. As an example, a series capacitance of 400 fF, e.g. with a tolerance of +/−5% or +/−10% or +/−50% may be used or even necessary to compensate the inductive matching element. This may correspond to a transistor width of 1 mm with a tolerance of +/−5% or +/−10% or +/−50%.

In the following, referring to FIGS. 3*a* and 3*b*, examples for the implementation of the second switchable element 350 as an example (e.g., as one option for implementation), referred to as switchable shunt resistor $R_{SH}$ herein, according to embodiments are disclosed.

As an example, the design of the switchable shunt resistors $R_{SH}$ may be implemented as series switch, e.g. 354, +resistor, e.g. 352:

The off capacitance $C_{OFF}$ of the switchable shunt resistors may be as low as possible to minimize parasitic capacitance for the HG modes, e.g. second operating modes. Linearity requirements and input power handling capability may have to be taken into account by the choice of the transistor width.

A resistance value be chosen to achieve with the $R_{ON}$ of the series switch the wanted attenuation and a good overall matching. The enabled shunt resistance in front of the LNA input may create a “forced” low ohmic matching, e.g. a “forced” 50 Ohm matching and additional input signal attenuation.

In the following, an example for an impedance matching according to embodiments of the disclosure will be explained in more detail. The following refers to FIGS. 3*a* and 3*b*.

First, to achieve a low ohmic environment, e.g. a 50 Ohm environment at $Z_{Circuit}$ to $RF_{in}$, it may be necessary to match the inductive matching element 360, e.g. in the form of a series off-chip matching inductor having an inductance $L_G$ and the input parasitics $C_{par}$, which may, for example, come from at least one of a phase shift of the RF-line between matching inductor and LNA input pad, aa metal area of the pad and ESD protection circuits.

This may, for example, be done by the first switchable element 340, e.g. in the form of a switchable capacitor, also called herein RF-switch (optionally using the switched-off $C_{OFF}$ in this). With the inductive matching element 360, e.g. in the form of the off-chip matching inductor, a series resonator may be created, which may achieve a low-ohmic environment for example for a wanted frequency near the 50 Ohm point (see e.g. FIG. 4).

Figure 4:
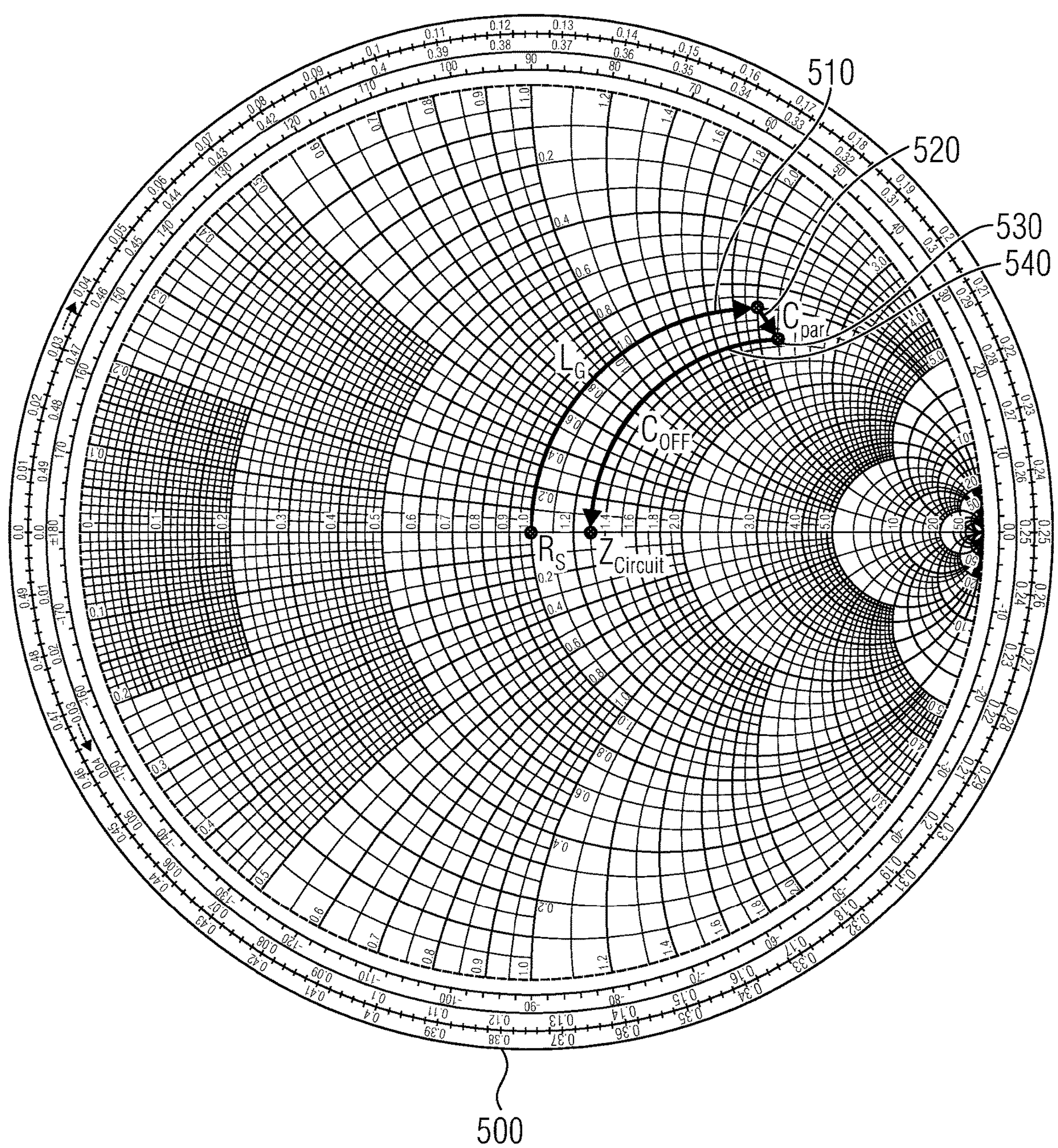
FIG. 4 shows an example for a Smith Diagram showing an impedance matching using the first switchable element according to embodiments of the disclosure.

FIG. 4 shows an example Smith Diagram showing an impedance matching using the first switchable element according to embodiments of the disclosure. FIG. 4 shows an example of a Smith diagram 500, and an impedance shift or respectively an impedance $Z_{Circuit}$ to $RF_{in}$. Starting from $R_S$ with $R_S$ being a source impedance, e.g. a low ohmic source impedance, e.g. of 50 Ohm, the inductive matching element 360 may cause an impedance shift 510 based on its inductivity $L_G$, e.g. an impedance shift $j\omega L_G$, with co being an angular frequency of a respective RF signal provided to $RF_{in}$ in FIG. 3, and with j being the imaginary unit. Accordingly, a further impedance shift 520 caused by parasitic capacitances $C_{par}$, as shown and explained in the context of FIG. 3 may be present. As explained before, $C_{OFF}$ of the first switchable element may be implemented such that a series resonator or at least approximately a series resonator is provided in order to convert the high ohmic impedance 530 to the low ohmic impedance $Z_{Circuit}$, close to the original $R_S$. This is shown by impedance shift 540.

Figure 5:
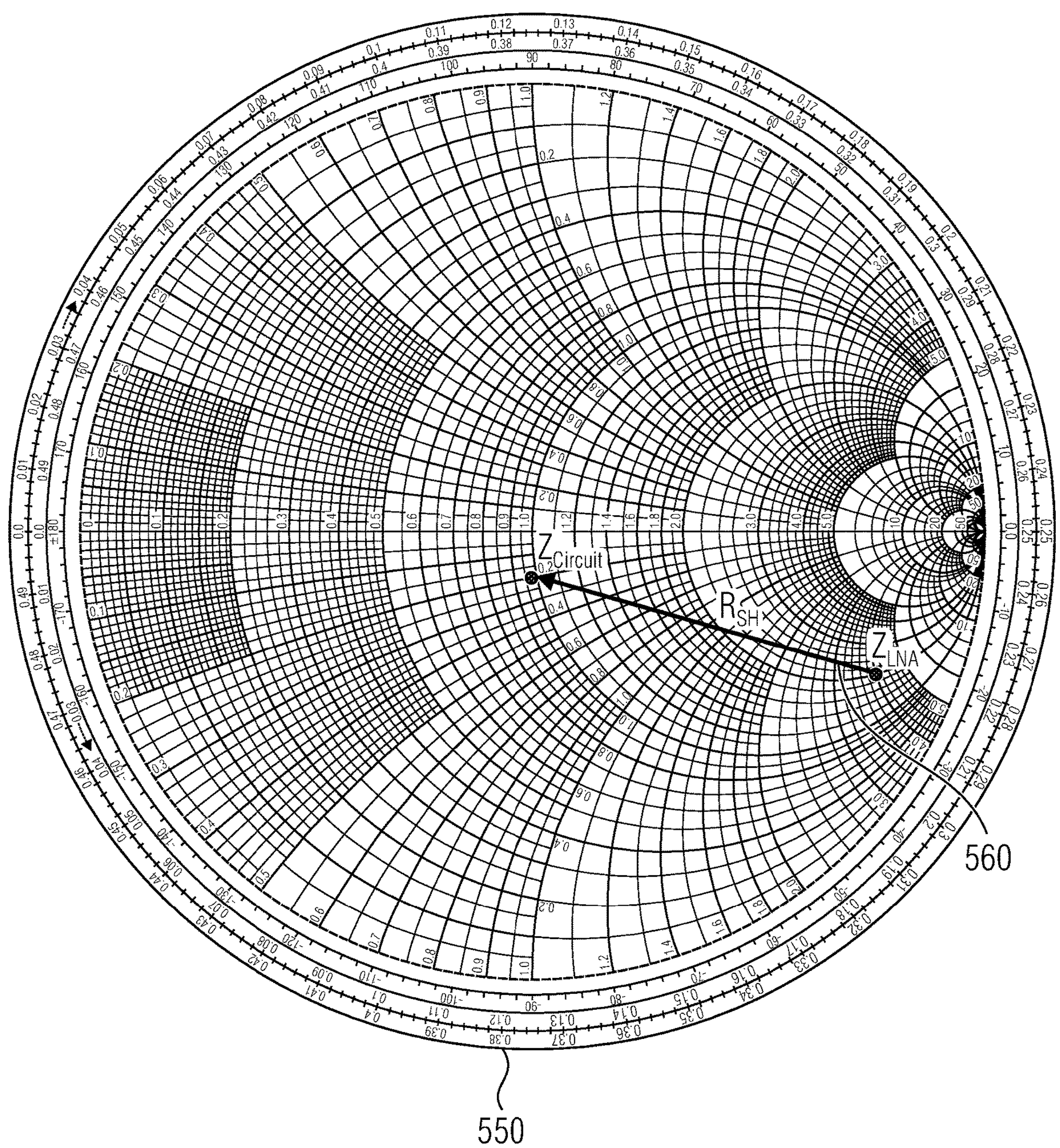
FIG. 5 shows an example for a Smith Diagram showing an impedance matching using the second switchable element according to embodiments of the disclosure.

Second, to match the high-ohmic, e.g. capacitive, LNA input impedance or in general the high ohmic input impedance of the amplifier, to the low ohmic, e.g. 50 Ohm environment ($Z_{Circuit}$), and to pre-attenuate the RF-signal, e.g. for low power gain, the second switchable element, for example a shunt resistor may be used. A shunt resistor may be a simple or even the simplest solution or implementation of the second switchable element. As shown in FIG. 5, the input impedance ($Z_{LNA}$) for common-source or common-drain LNA input-stages are capacitive high-ohmic (e.g. CMOS and Bipolar). By using a shunt resistor $R_{SH}$ in front of the LNA-transistor, a nearly 50 Ohm environment (in general low ohmic environment) is achievable.

FIG. 5 shows an example for a Smith Diagram showing an impedance matching using the second switchable element, according to embodiments of the disclosure. FIG. 5 shows an example of a Smith diagram 550, and an impedance shift or respectively an impedance $Z_{Circuit}$ to $Z_{LNA}$. As shown, an impedance shift 560 caused by the resistive element of the second switchable element may allow to convert the high ohmic $Z_{LNA}$ to the low ohmic $Z_{Circuit}$.

Figure 6:
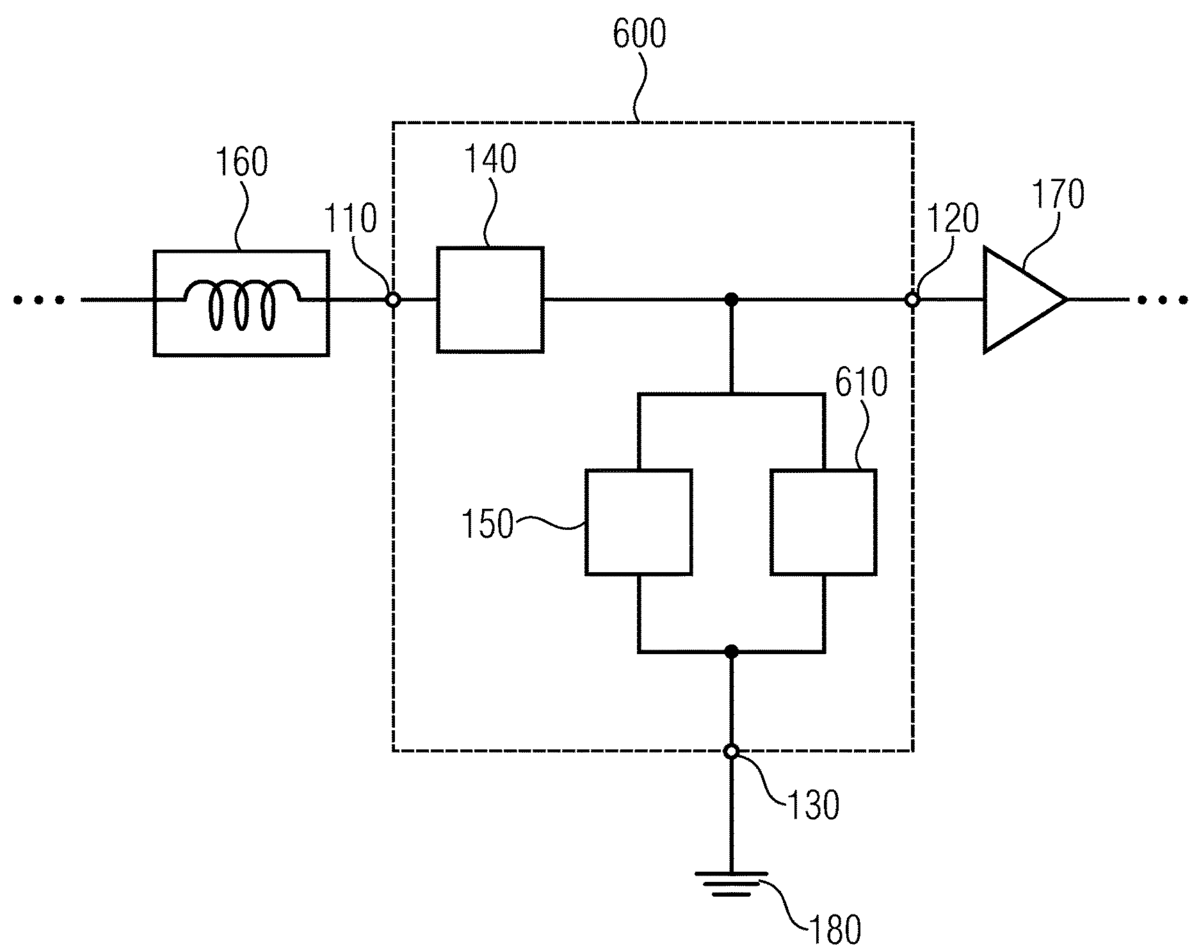
FIG. 6 shows a schematic view of a circuitry comprising a further switchable element according to embodiments of the disclosure.

FIG. 6 shows a schematic view of circuitry comprising a further switchable element according to embodiments of the disclosure. FIG. 6 shows, apart from the elements as explained in the context of FIGS. 1 to 3, circuitry 600 comprising an additional switchable element 610, the additional switchable element 610 being a resistive element coupled between the signal output 120 and the reference output 130 when the circuitry is in a third operating mode. In this third operating mode, the first switchable element 140 may be a capacitive element coupled between the signal input 110 and the signal output 120.

The additional switchable element may be configured to match the high ohmic input impedance of the amplifier 170 at the signal output 120 to the low ohmic impedance at the output of the first switchable element 140 and to attenuate a radio frequency (RF) signal provided from the inductive matching element 160 to the amplifier 170, when the circuitry 600 is in the third operating mode.

Furthermore, an attenuation of the RF signal provided in the third operating mode may be different from an attenuation of the RF signal provided in the first operating mode.

In other words, a plurality of switchable elements may be coupled between the first switchable element, the signal output 120 and the reference output 130. This may allow provision of a plurality of attenuation modes and/or impedance matchings.

Hence, as an example, in the first operating mode the second switchable element 150 may act as a resistive element as explained before and the additional switchable element 610 may be configured to uncouple itself from the reference output 130 hence, approximately or substantially minimizing an influence of element 610 on circuitry 600. Therefore, a first low-gain mode, with low signal amplification and high signal linearity may be provided.

Vice versa, in the third operating mode, the additional switchable element 610 may act as a resistive element, providing an impedance matching and signal attenuation different from the signal attenuation provided by the second switchable element 150 in the first operating mode, while in the third operating mode the second switchable element 150 may be configured to uncouple itself from the reference output 130.

Optionally, an operating mode may be provided in which both switchable elements 150 and 610 may be coupled with the reference output, in order to jointly attenuate an RF signal and to provide an impedance matching.

Additionally, it is to be noted, that if the amplifier, e.g. LNA, also supports passive bypass modes, the second switchable element, e.g. switchable shunt resistor, can be implemented in a bypass path, which may reduce parasitic effects to zero or substantially to zero in a second operating mode, e.g. the HG mode, compared to the pre-attenuator method in 14 or 15. Also, these shunt resistors can be re-used for different passive bypass modes, e.g. between −12 dB to −6 dB power gain, which may reduce complexity even further.

Furthermore, it is to be noted that the first switchable element 140, e.g. the Pre-Switch may be arranged between an ESD protection cell and the inductive matching element 160 and the second switchable element and the additional switchable element (as explained before, the second and further switchable element for example providing two different first operating modes, or for example, two different no or low gain modes). In other words, embodiments may comprise additionally ESD protection cells, an influence of which may be addressed or taken into account with a parasitic capacitance $C_{par}$.

In the following simulative comparison, results between circuitry according to embodiments of the disclosure and conventional approaches are discussed.

Figure 7:
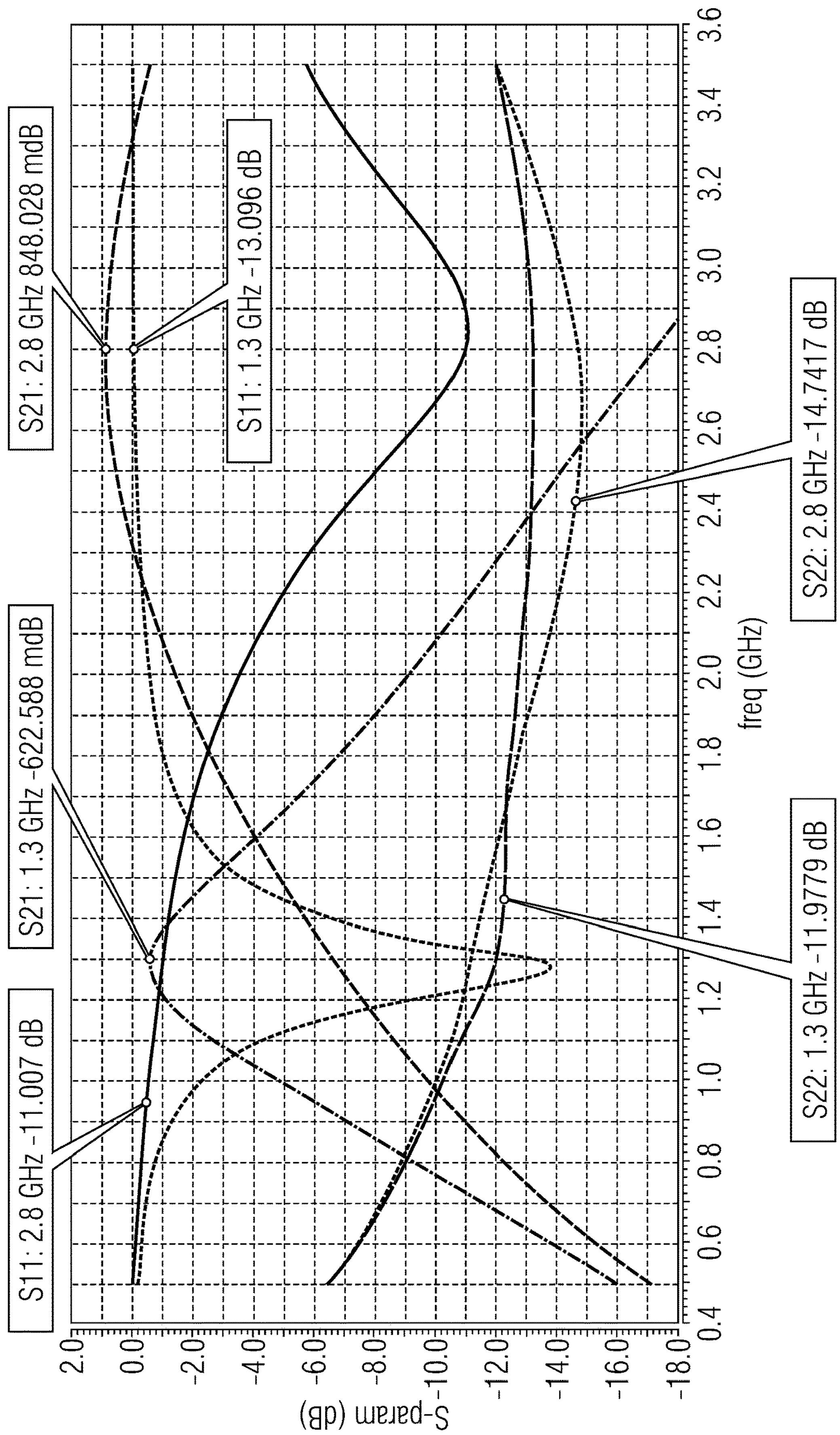
FIG. 7 shows an example for simulation results with circuitry according to embodiments of the disclosure.

FIG. 7 shows an example for simulation results with circuitry according to embodiments of the disclosure, e.g. S-parameter simulation results, of the novel no/low-gain mode according to embodiments. FIG. 7 shows an example for simulation results for a first operating mode according to embodiments, e.g. a novel no/low-gain mode, e.g. a 0 dB gain mode, with a single cascade LNA with common-drain output stage, matched for 1.3 GHz and 2.8 GHz. Shown are S-parameters in dB over frequency in GHz. A gain variation of only 1.5 dB is achieved with the same LNA core, e.g. the same amplifier, by only changing the off-chip matching inductor. Input and power match at the same frequency is achieved with a Sn lower −10 dB.

Figure 8:
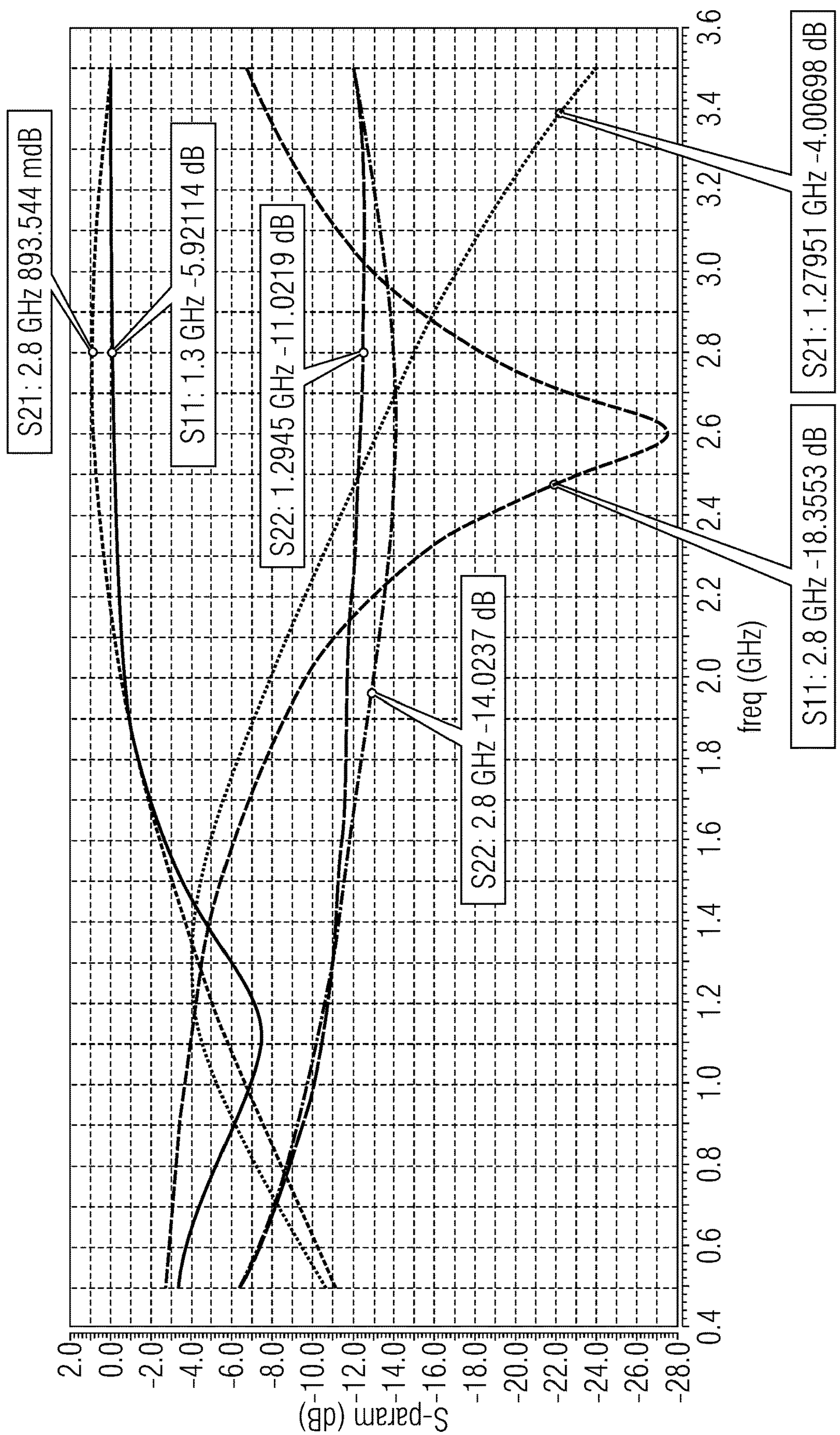
FIG. 8 shows an example for simulation results with circuitry according conventional approaches.

FIG. 8 shows an example for simulation results with circuitry according conventional approaches. FIG. 8 shows S-parameter simulation results with a pre-attenuator after the off-chip matching inductor. FIG. 8 shows an example for simulation results for a conventional pre-attenuator circuit (e.g., according to FIG. 15) with the same single cascade LNA with common-drain output stage. This circuit is also matched for 1.3 GHz and 2.8 GHz with the same off-chip matching inductors as in FIG. 7. A high gain (5 dB) and Si, variation over frequency is visible. An excellent input and power match at the same frequency is not possible.

Figure 9A:
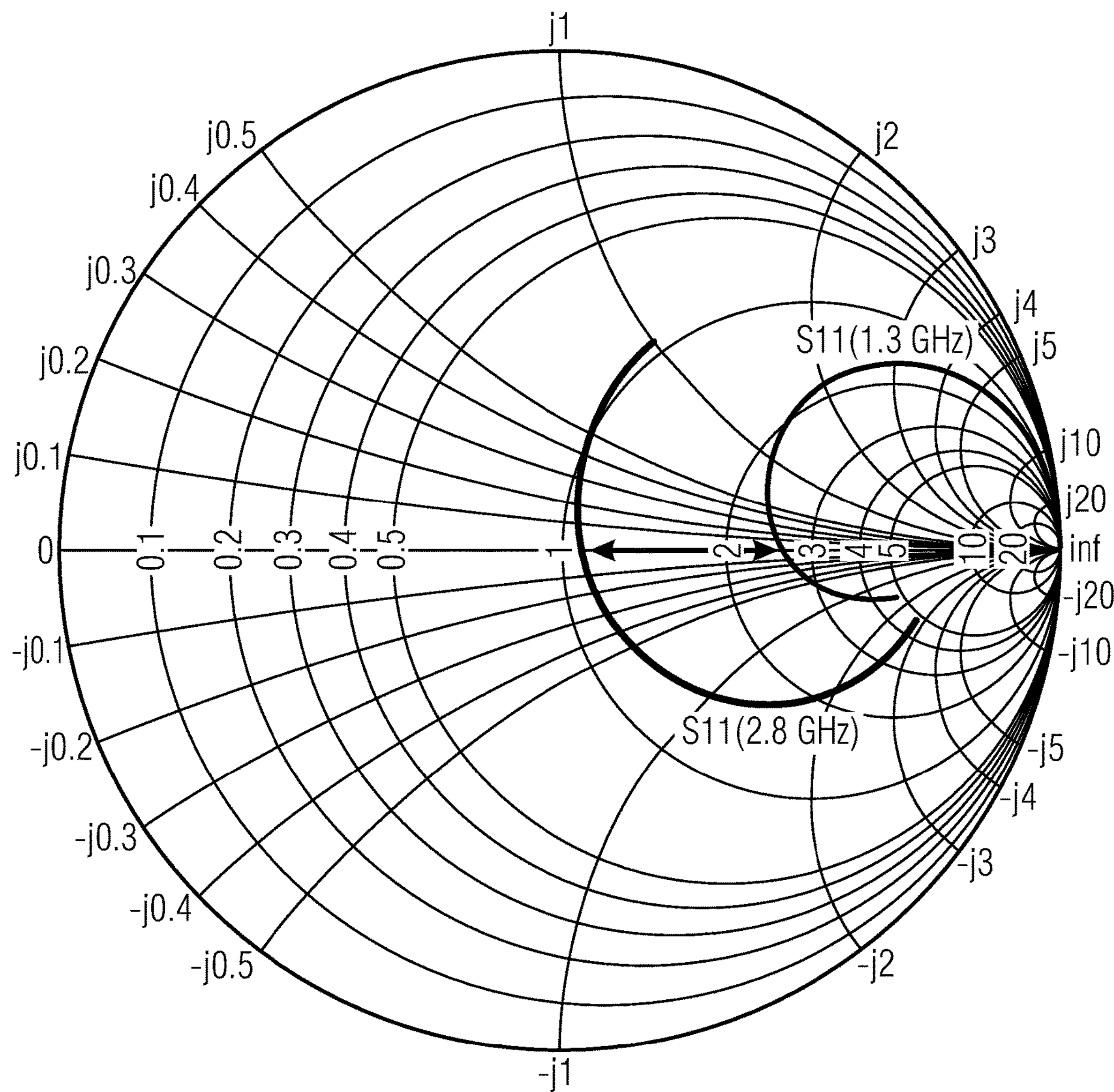
FIGS. 9*a* and 9*b* show an example for an input matching according to embodiments and conventional approaches.
Figure 9B:
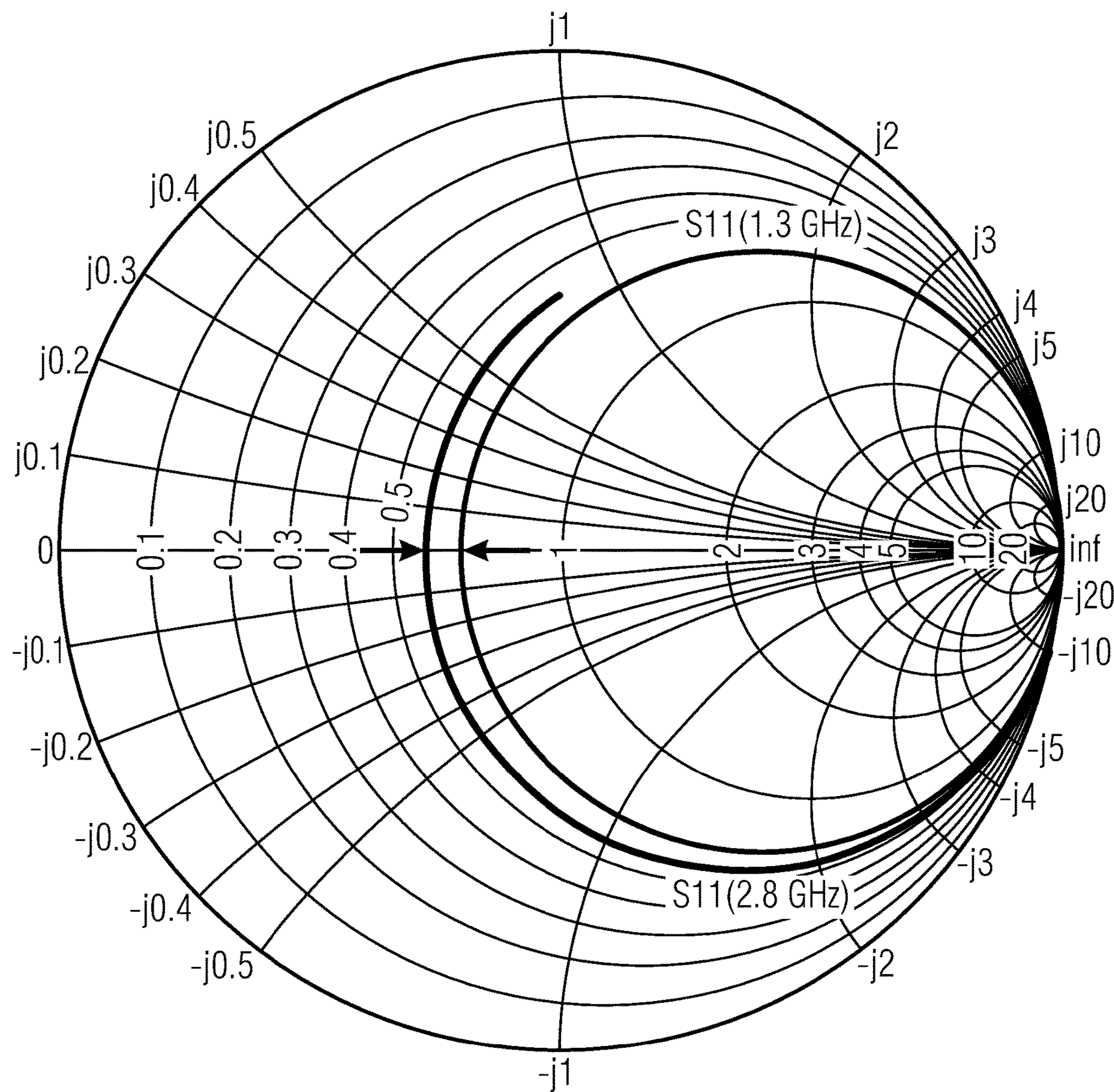

FIGS. 9*a* and 9*b* show an example for an input matching according to embodiments (b) and conventional approaches (a). FIG. 9*a* shows an example of the input impedance of a conventional no/low gain mode with pre-attenuator (e.g., according to FIG. 15) and FIG. 9*b* an example for the first operating mode according to embodiments, as an example a novel no/low gain mode. The novel no/low gain mode shows for the input impedance a much lower impedance deviation compared to the conventional circuit, which results in a stable and equal RF-performance over frequency. In other words, FIG. 9*a* may show a conventional input matching and FIG. 9*b* an input matching according to embodiments, wherein the input matching according to embodiments allows to provide, in a first operating mode, e.g. a no and/or low gain mode, significantly better performance.

Figure 10:
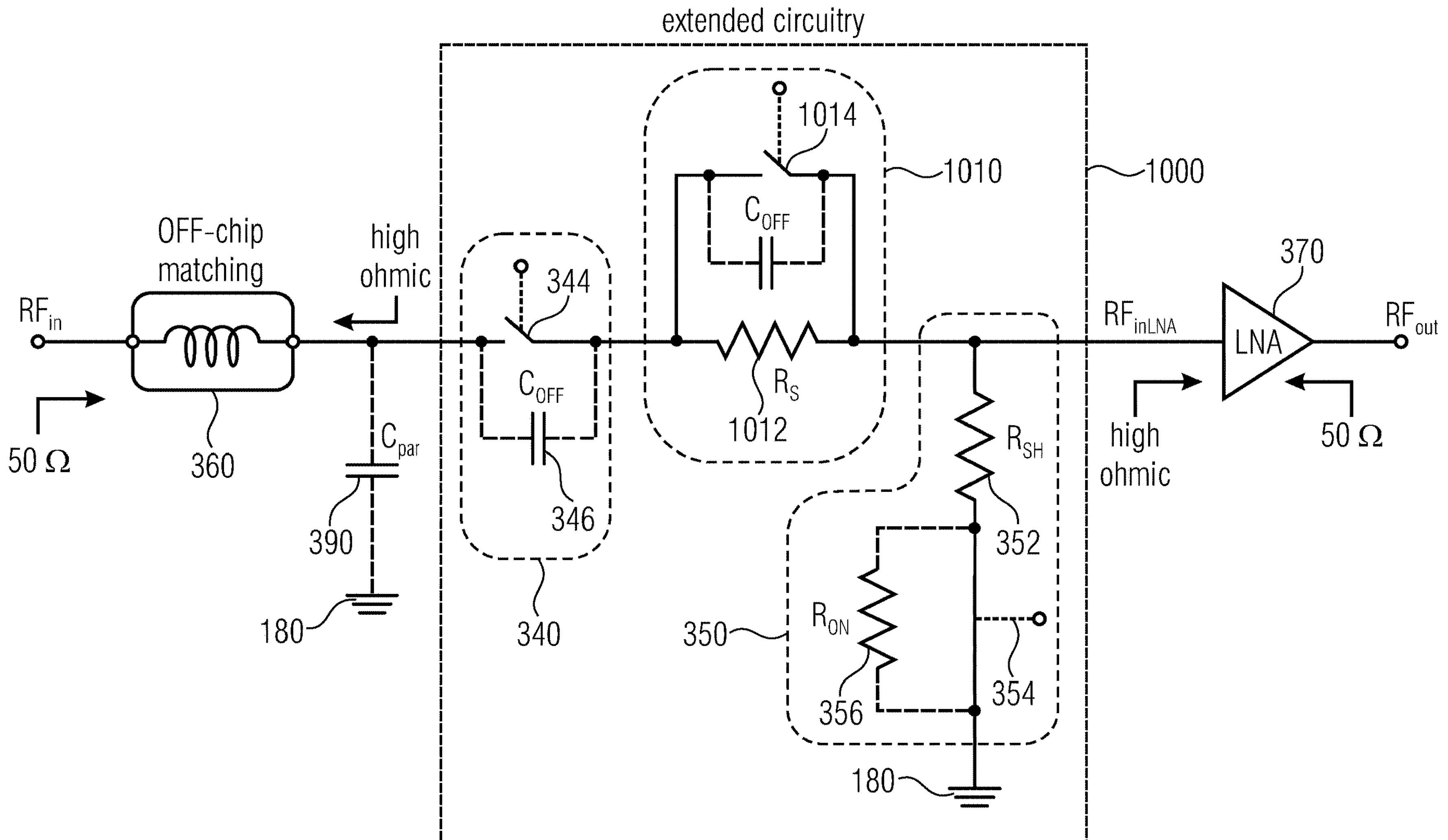
FIG. 10 shows a schematic view of an extended circuitry according to embodiments of the disclosure.

FIG. 10 shows a schematic view of an extended circuitry according to embodiments of the disclosure. FIG. 10 shows, in addition to elements as explained in the context of FIGS. 3*a* and 3*b*, an extended circuitry 1000 comprising a further switchable element 1010, being a resistor coupled between the signal input and the signal output, when the circuitry is in the first operating mode, in order to further attenuate the RF signal and in order to improve the output matching.

As another optional feature, the further switchable element 1010 comprises a parallel circuit of a further resistive element $R_S$ 1012 and a switch 1014. As an example, switch 1014 may be configured to bypass the further resistive element 1012 between the signal input and the signal output when the circuitry 1000 is in a second operating mode.

As an example, in the first operating mode, as shown in FIG. 10, the switch may be open, such that the resistive element 1012 is affecting an RF signal provided from the inductive matching element 360 to the amplifier 370. In such a configuration, the switch itself may only affect a signal in a limited way because of a parasitic capacitance $C_{OFF}$.

In the second operating mode, switch 1014 may be closed, e.g. only influencing the circuitry with a minor parasitic resistance, e.g. an $R_{ON}$, such that resistive element $R_S$ 1012 is effectively or substantially bypassed. Hence, a signal attenuation and or an impedance matching may be adapted. As another example, in a first operating mode where the first and second switchable element operate as capacitive and respectively resistive element, the further switchable element may optionally be active, e.g. acting or being the resistive element $R_S$ 1012 or disabled, e.g. being substantially without impact, e.g. only with a minor switch resistance $R_{ON}$ for a respective RF signal.

In other words, FIG. 10 may show an enhanced input matching circuitry or an enhanced input matching concept according to embodiments of the disclosure.

For example, in the case of high parasitic effects at $RF_{in}$, or also in case a low shunt resistor $R_{SH}$, or as an example a second switchable element 350 being substantially a resistive element, e.g. $R_{SH}$ or $R_{SH}+R_{ON}$ with low resistance, is needed to achieve a wanted attenuation, an input matching could become too low-ohmic. A $S_{11}$ lower −10 dB may not be reached anymore. In this case, an additional switchable element 1010, e.g. comprising or being or representing or operating as a series resistor $R_S$ 1012, which can, for example, be shunted, e.g. using switch 1014, for all other operating or gain modes between the first switchable element 340, e.g. the Pre-Switch, and the second switchable element 350, e.g. being or comprising the switchable shunt resistor $R_{SH}$ may be implemented (e.g. as shown in FIG. 10). This additional switchable element being or operating as a resistor may enable a second degree of freedom to pre-attenuate an input signal and also to match the input well to a low ohmic environment, e.g. to match the input well or even perfectly to 50 Ohm.

Here, it is to be noted that for example a setup according to FIG. 3*a* or 3*b* may have the advantages of a lower NF degradation, e.g. as an example of 0.03 dB less in the second operating mode, e.g. in a HG mode and a lower complexity.

In general, circuits according to embodiments of the disclosure enable a lower gain step error variation over frequency, which may be necessary to achieve (e.g., 1 dB to 1.5 dB).

Furthermore, it is to be noted that according to embodiments no/low gain modes can be used for a plurality or for example even all LNAs (e.g. Bulk CMOS, SOI CMOS, Bipolar, BiCMOS), e.g. if a low $R_{on}C_{OFF}$ transistor is available. Hence, embodiments may comprise switches with transistors with low $R_{on}$ and with low $C_{OFF}$ and amplifiers may be CMOS, SOI CMOS, Bipolar and/or BiCMOS amplifiers.

Furthermore, according to embodiments, the circuitry, e.g. the first switchable element of the circuitry, may comprise (or may be) a series transistor at the input of the amplifier, e.g. LNA input. The transistor may be arranged or located close to the RF input pad, e.g. of the amplifier, wherein the series transistor may have a visible size. Also, the further switchable element, if necessary or if present, may comprise or may be a series transistor (e.g., element 190 as shown in FIG. 2 or element 1014 as shown in FIG. 10), for example having a large size. In addition, embodiments according to the disclosure may, for example be characterized by the distinct S-parameters S11 and/or S21 (see e.g., FIG. 7 and/or FIG. 9*b*).

In general, it is to be noted that embodiments of the disclosure may, for example, be implemented in SOI technologies e.g. CMOS or Bipolar technology.

Figure 11:
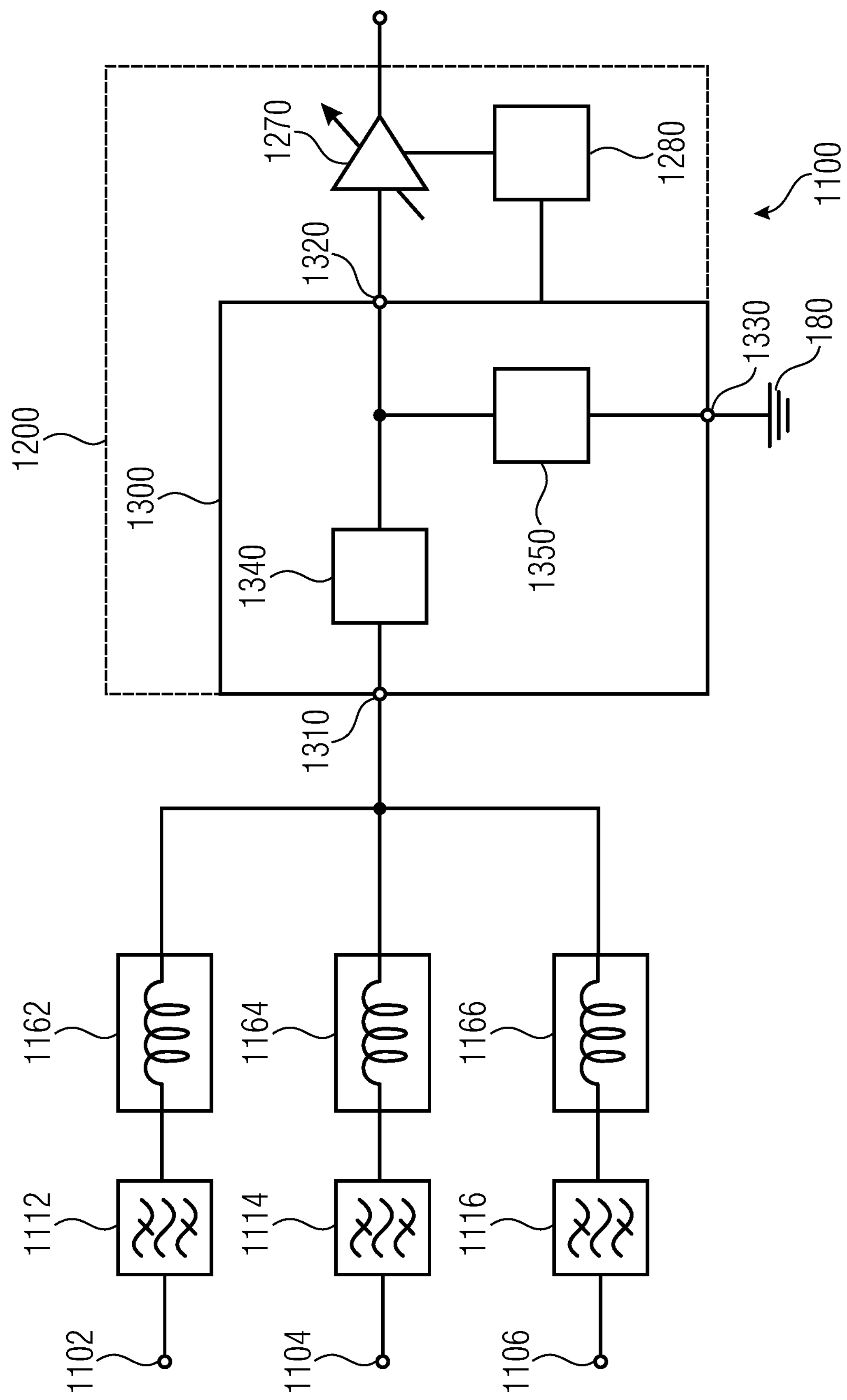
FIG. 11 shows a schematic view of a system according to embodiments of the disclosure.

FIG. 11 shows a schematic view of a system according to embodiments of the disclosure. FIG. 11 shows system 1100 comprising a circuit module 1200, the circuit module 1200 comprising a circuitry 1300 having a signal input 1310, a signal output 1320 and a reference output 1330 and an amplifier 1270. The circuitry 1300 comprises a first and second switchable element 1340, 1350 and the reference output 1330 of circuitry 1300 is coupled with a reference potential 180, e.g. earth. Circuitry 1300 may comprise any or all of the features as explained above, to name only some examples, an additional switchable element, and/or a further switchable element, with any switchable element being or comprising a transistor or a parallel circuit of a switch and a capacitor or a parallel circuit of a switch and a resistor.

It is to be noted that embodiments of the disclosure may comprise a circuit module 1300 comprising the elements as explained before (e.g., without the further features of the system 1100). As another optional feature, amplifier 1270 is a controllable amplifier and the circuit module further comprises a control unit 1280, configured to control the amplifier 1270 in dependence on an operating mode of the circuit 1300. Furthermore, optionally, the control circuit 1280 may be configured to set the amplifier 1270 to a no gain or low gain mode in the first operating mode and/or to set the amplifier to a high gain mode in the second operating mode.

Optionally, the circuit module may be configured to amplify an RF signal provided to the signal input 1310 by at least −3 dB and at most 0 dB or by at least 3 dB and at most 6 dB, in the first operating mode, in order to achieve a high linearity of the RF signal.

The amplifier 1270 may, for example, be one of a Bulk CMOS amplifier, a SOI CMOS amplifier, a bipolar amplifier and/or a BiCMOS amplifier. Hence, embodiments are not limited to a specific type of amplifier technology.

As another optional feature, system 1100 further comprises an inductive matching element 1162, wherein the output of the inductive matching element is coupled with the signal input 1310 and a system input 1102, wherein the system input is coupled with an input of the inductive matching element 1162. The inductive matching element 1162 may be configured to match an input impedance of the inductive matching element 1162 to the high ohmic input impedance of the amplifier 1270. With the system comprising the inductive matching element, the first switchable element may be adjusted precisely for converting the high ohmic output impedance of the inductive matching element.

As another optional feature, system 1100 comprises a bandpass filter 1112, wherein an input of the bandpass filter 1112 is coupled with the system input 1102 and wherein an output of the bandpass filter 1112 is coupled with the input of the inductive matching element 1162. The bandpass filter may be configured to pass a specific frequency range of an RF signal provided to the system input 1102. Using a filter signal quality may be improved, e.g. by filtering unwanted frequency portions.

As another optional feature, system 1100 comprises a plurality of further system inputs 1104, 1106, a plurality of further inductive matching elements 1164, 1166 and a plurality of further bandpass filters 1114, 1116, wherein an input of a respective further bandpass filter 1114, 1116 is coupled with a respective further system input 1104, 1106, and wherein an output of a further bandpass filter 1114, 1116 is coupled with an input of a respective further inductive matching element 1164, 1166 and wherein a respective output of a further matching element is coupled with the signal input 1120.

As an example, a respective further inductive matching element 1164, 1166 may be configured to convert a respective input impedance of the respective inductive matching element 1164, 1166 to the high ohmic input impedance of the amplifier 1270, and a respective further bandpass filter **1*n*4, 1116 may be configured to pass a specific frequency range of an RF signal provided to a respective further system input 1104, 1106**.

Hence, the system may allow the processing of signals having a plurality of different frequencies or frequency bands.

As an example, system 1100 may be a system for pre-attenuating an amplifier.

Figure 12:
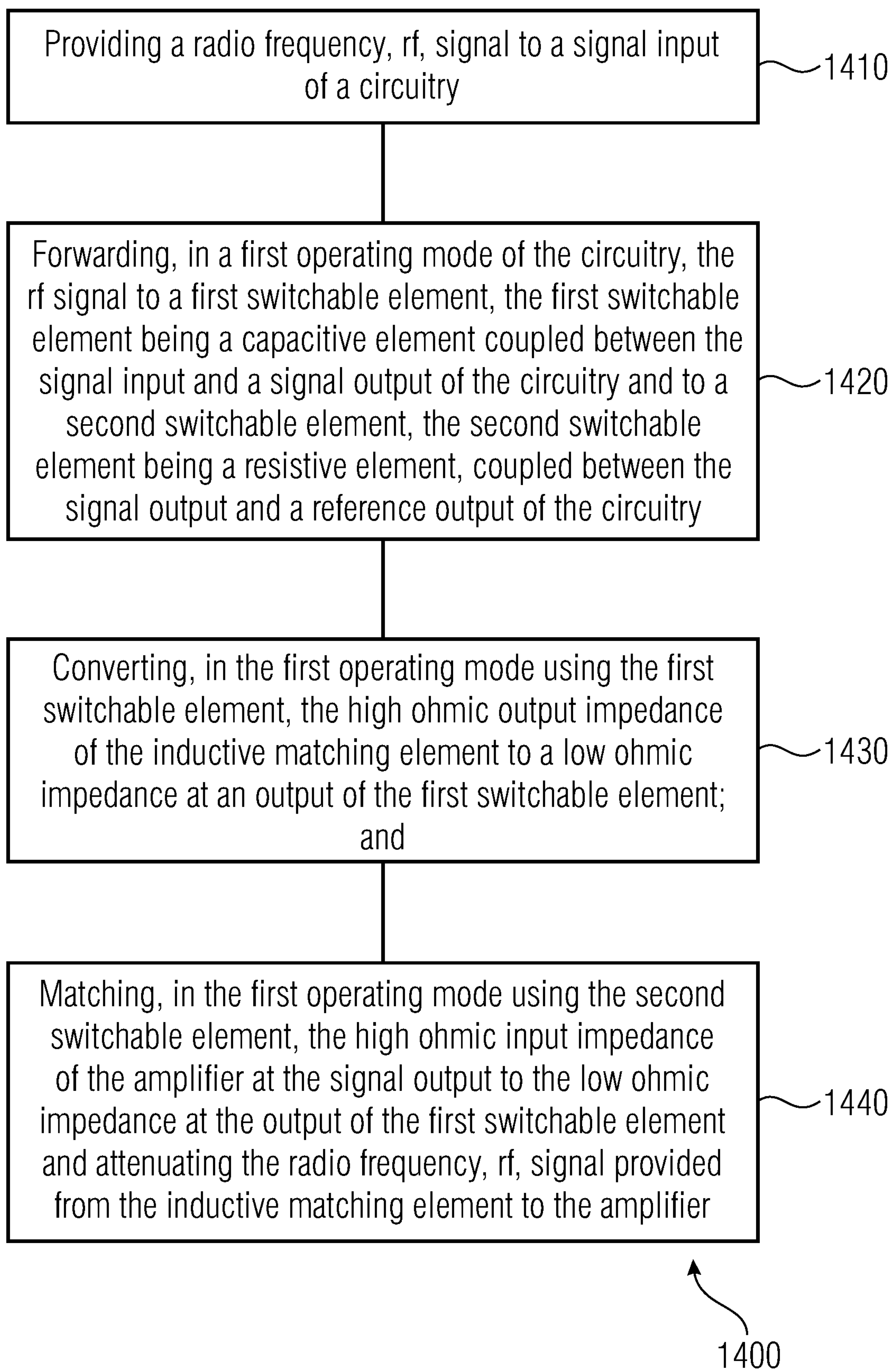
FIG. 12 shows a schematic block diagram of a method according to embodiments of the disclosure.
Figure 13:
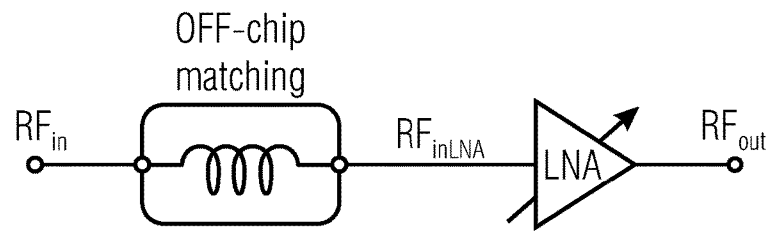
FIG. 13 shows an example for an RFFE LNA with external matching inductor.

FIG. 12 shows a schematic block diagram of a method according to embodiments of the disclosure. FIG. 12 shows method 1400 comprising providing 1 a radio frequency (RF) signal to a signal input of a circuitry, wherein the signal input is coupled to an inductive matching element of a radio frequency front end, RFFE, the inductive matching element having a high ohmic output impedance for the RF signal. The method further comprises forwarding 1, in a first operating mode of the circuitry, the RF signal to a first switchable element, the first switchable element being a capacitive element coupled between the signal input and a signal output of the circuitry and to a second switchable element, the second switchable element being a resistive element, coupled between the signal output and a reference output of the circuitry, wherein the signal output is coupled to an input of an amplifier of the RFFE, the input of the amplifier having a high ohmic input impedance for the RF signal. Moreover, the method 1400 comprises converting 1430, in the first operating mode using the first switchable element, the high ohmic output impedance of the inductive matching element to a low ohmic impedance at an output of the first switchable element and matching 1440, in the first operating mode using the second switchable element, the high ohmic input impedance of the amplifier at the signal output to the low ohmic impedance at the output of the first switchable element and attenuating the radio frequency (RF) signal provided from the inductive matching element to the amplifier.

Method 1400 may hence be a method for pre-attenuating an amplifier.

In general, it is to be noted that embodiments of the disclosure may allow an efficient circuit design for impedance matching and/or pre-attenuation of an (RF) signal. Furthermore, embodiments according to the disclosure may be used for or with RF front-end amplifiers, RF front-end low-noise amplifiers, and/or for mobile communication.

Embodiments according to the disclosure comprise a circuitry for a radio frequency front end, RFFE, the circuitry comprising a signal input to be coupled to an inductive matching element of the RFFE, the inductive matching element having a high ohmic output impedance for a radio frequency (RF) signal, a signal output to be coupled to an input of an amplifier of the RFFE, the input of the amplifier having a high ohmic input impedance for the RF signal, a reference output to be coupled to a reference potential, a first switchable element, being a capacitive element coupled between the signal input and the signal output when the circuitry is in a first operating mode and a second switchable element, being a resistive element coupled between the signal output and the reference output when the circuitry is in the first operating mode.

Furthermore, the first switchable element is configured to convert the high ohmic output impedance of the inductive matching element to a low ohmic impedance at an output of the first switchable element when the circuitry is in the first operating mode, and the second switchable element is configured to match the high ohmic input impedance of the amplifier at the signal output to the low ohmic impedance at the output of the first switchable element and to attenuate the RF signal provided from the inductive matching element to the amplifier, when the circuitry is in the first operating mode.

According to further embodiments of the disclosure, the first switchable element is a single transistor, a parallel circuit of a capacitor and a transistor and/or a PIN diode. Furthermore, a respective transistor or diode of the first switchable element is configured to be switched in an off state in the first operating mode and in an on state in a second operating mode.

According to further embodiments of the disclosure, the second switchable element comprises a series circuit comprising a resistive element and a switch and the switch is configured to couple the resistive element between the signal output and the reference output when the circuitry is in the first operating mode and to uncouple the resistive element between the signal output and the reference output when the circuitry is in a second operating mode.

According to further embodiments of the disclosure, the circuitry comprises a further switchable element. Furthermore, the further switchable element is a resistor coupled between the signal input and the signal output, when the circuitry is in the first operating mode, in order to further attenuate the RF signal and in order to improve the output matching.

According to further embodiments of the disclosure, the further switchable element comprises a parallel circuit of a further resistive element and a switch and the switch is configured to bypass the further resistive element between the signal input and the signal output when the circuitry is in a second operating mode.

According to further embodiments of the disclosure, the first switchable element is configured to provide a series resonator with the inductive matching element and an input parasitic capacitance in order to convert the high ohmic output impedance of the inductive matching element to the low ohmic impedance.

According to further embodiments of the disclosure, the first switchable element is a capacitive element coupled between the signal input and the signal output when the circuitry is in a third operating mode and the circuitry comprises an additional switchable element, being a resistive element coupled between the signal output and the reference output when the circuitry is in the third operating mode. Furthermore, the additional switchable element is configured to match the high ohmic input impedance of the amplifier at the signal output to the low ohmic impedance at the output of the first switchable element and to attenuate a radio frequency (RF) signal provided from the inductive matching element to the amplifier, when the circuitry is in the third operating mode. Moreover, an attenuation of the RF signal provided in the third operating mode is different from an attenuation of the RF signal provided in the first operating mode.

Further embodiments of the disclosure comprise a circuit module, the circuit module comprising a circuitry according to any of the embodiments disclosed herein, and the amplifier, wherein the signal output is coupled to the input of the amplifier.

According to further embodiments of the disclosure, the circuit module is configured to amplify an RF signal provided to the signal input by at least −3 dB and at most 0 dB or by at least 3 dB and at most 6 dB, in the first operating mode, in order to achieve a high linearity of the RF signal.

According to further embodiments of the disclosure, the amplifier is a controllable amplifier and the circuit module comprises a control unit, configured to control the amplifier in dependence on an operating mode of the circuit. Furthermore, the control circuit is configured to set the amplifier to a no gain or low gain mode in the first operating mode and/or to set the amplifier to a high gain mode in the second operating mode.

According to further embodiments of the disclosure, the amplifier is one of a Bulk CMOS amplifier, a SOI CMOS amplifier, a bipolar amplifier and/or a BiCMOS amplifier.

Further embodiments of the disclosure comprise a system comprising: a circuit module according to any of embodiments as disclosed herein and the inductive matching element, wherein the output of the inductive matching element is coupled with the signal input and a system input, wherein the system input is coupled with an input of the inductive matching element, and wherein the inductive matching element is configured to match an input impedance of the inductive matching element to the high ohmic input impedance of the amplifier.

According to further embodiments of the disclosure, the system comprises a bandpass filter; and an input of the bandpass filter is coupled with the system input. Furthermore, an output of the bandpass filter is coupled with the input of the inductive matching element and the bandpass filter is configured to pass a specific frequency range of the RF signal provided to the system input.

According to further embodiments of the disclosure, the system comprises a plurality of further system inputs and the system comprises a plurality of further inductive matching elements and a plurality of further bandpass filters.

Furthermore, an input of a respective further bandpass filter is coupled with a respective further system input, an output of a further bandpass filter is coupled with an input of a respective further inductive matching element, and a respective output of a further matching element is coupled with the signal input.

Moreover, a respective further inductive matching element is configured to convert a respective input impedance of the respective inductive matching element to the high ohmic input impedance of the amplifier, and a respective further bandpass filter is configured to pass a specific frequency range of an RF signal provided to a respective further system input.

Further embodiments of the disclosure comprise a method for impedance matching and signal attenuation, the method comprising providing a radio frequency (RF) signal to a signal input of a circuitry, wherein the signal input is coupled to an inductive matching element of a radio frequency front end, RFFE, the inductive matching element having a high ohmic output impedance for the RF signal.

The method further comprises forwarding, in a first operating mode of the circuitry, the RF signal to a first switchable element, the first switchable element being a capacitive element coupled between the signal input and a signal output of the circuitry and to a second switchable element, the second switchable element being a resistive element, coupled between the signal output and a reference output of the circuitry.

Furthermore, the signal output is coupled to an input of an amplifier of the RFFE, the input of the amplifier having a high ohmic input impedance for the RF signal and the reference output is coupled to a reference potential.

The method further comprises converting, in the first operating mode using the first switchable element, the high ohmic output impedance of the inductive matching element to a low ohmic impedance at an output of the first switchable element and matching, in the first operating mode using the second switchable element, the high ohmic input impedance of the amplifier at the signal output to the low ohmic impedance at the output of the first switchable element and attenuating the radio frequency (RF) signal provided from the inductive matching element to the amplifier.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A radio frequency front end (RFFE) circuit comprising:

a signal input configured to be coupled to an inductive matching element of the RFFE, the inductive matching element having a first output impedance for a radio frequency (RF) signal;

a signal output configured to be coupled to an input of an amplifier of the RFFE, the input of the amplifier having a first input impedance for the RF signal;

a reference output configured to be coupled to a reference potential;

a switchable capacitive element coupled between the signal input and the signal output when the circuit is in a first operating mode; and a switchable resistive element coupled between the signal output and the reference output when the circuit is in the first operating mode, wherein:

the switchable capacitive element is configured to convert the first output impedance of the inductive matching element to a second output impedance at an output of the switchable capacitive element when the circuit is in the first operating mode, wherein the second output impedance is less than the first output impedance, and the switchable resistive element is configured to convert the first input impedance of the amplifier at the signal output to the second output impedance at the output of the switchable capacitive element and to attenuate the RF signal provided from the inductive matching element to the amplifier, when the circuit is in the first operating mode, wherein the second output impedance is less than the first input impedance.

2. The circuit according to claim 1, wherein the switchable capacitive element is a single transistor, a capacitor and a transistor coupled in parallel; or a PIN diode; and wherein a respective transistor or diode of the switchable capacitive element is configured to be switched in an off-state in the first operating mode and switched in an on-state in a second operating mode.

3. The circuit according to claim 1, wherein:

the switchable resistive element comprises a series circuit comprising a resistive element and a switch; and the switch is configured to:

couple the resistive element between the signal output and the reference output during the first operating mode, and uncouple the resistive element between the signal output and the reference output during a second operating mode.

4. The circuit according to claim 1, wherein:

the circuit further comprises a further switchable element; and the further switchable element is a resistor coupled between the signal input and the signal output during the first operating mode to further attenuate the RF signal.

5. The circuit according to claim 4, wherein:

the further switchable element comprises a further resistive element and a switch coupled in parallel; and the switch is configured to bypass the further resistive element between the signal input and the signal output during a second operating mode.

6. The circuit according to claim 1, wherein the switchable capacitive element in combination with the inductive matching element and an input parasitic capacitance is configured to provide a series resonator.

7. The circuit according to claim 1, wherein:

the switchable capacitive element comprises a capacitive element coupled between the signal input and the signal output during a third operating mode;

the circuit further comprises an additional switchable resistive element coupled between the signal output and the reference output during the third operating mode; and the additional switchable resistive element is configured to convert the first input impedance of the amplifier at the signal output to the second output impedance at the output of the switchable capacitive element and to attenuate the RF signal provided from the inductive matching element to the amplifier during the third operating mode; and an attenuation of the RF signal during the third operating mode is different from an attenuation of the RF signal during the first operating mode.

8. A circuit module comprising:

the circuit according to claim 1, and the amplifier, wherein the signal output is coupled to the input of the amplifier.

9. The circuit module according to claim 8, wherein the circuit module is configured to amplify the RF signal provided to the signal input between −3 dB and 6 dB during the first operating mode to achieve a high linearity of the RF signal.

10. The circuit module according to claim 8, wherein:

the amplifier is a controllable amplifier;

the circuit module comprises a control circuit configured to control the amplifier depending on an operating mode of the circuit; and the control circuit is configured to:

set the amplifier to a no gain mode or low gain mode during the first operating mode, and set the amplifier to a high gain mode during a second operating mode.

11. The circuit module according to claim 8, wherein the amplifier is one of a Bulk CMOS amplifier, a SOI CMOS amplifier, a Bipolar amplifier or a BiCMOS amplifier.

12. A system comprising:

the circuit module according to claim 8;

the inductive matching element, wherein the output of the inductive matching element is coupled with the signal input; and a system input, wherein the system input is coupled with an input of the inductive matching element, wherein the inductive matching element is configured to convert an input impedance of the inductive matching element to the first input impedance of the amplifier.

13. The system according to claim 12, wherein:

the system comprises a bandpass filter;

an input of the bandpass filter is coupled to the system input;

an output of the bandpass filter is coupled with the input of the inductive matching element; and the bandpass filter is configured to pass a specific frequency range of the RF signal provided to the system input.

14. The system according to claim 13, wherein:

the system comprises a plurality of further system inputs;

the system comprises a plurality of further inductive matching elements and a plurality of further bandpass filters;

an input of a respective further bandpass filter is coupled with a respective further system input, and wherein an output of a further bandpass filter is coupled with an input of a respective further inductive matching element, and wherein a respective output of a further inductive matching element is coupled with the signal input;

the respective further inductive matching element is configured to convert a respective input impedance of the respective inductive matching element to the first input impedance of the amplifier; and the respective further bandpass filter is configured to pass a specific frequency range of an RF signal provided to the respective further system input.

15. A method comprising:

receiving a radio frequency (RF) signal at a signal input, wherein the signal input is coupled to an inductive matching element of a radio frequency front end (RFFE), the inductive matching element having a first output impedance for the RF signal;

forwarding, during a first operating mode, the RF signal to a switchable capacitive element coupled between the signal input and a signal output and to a switchable resistive element coupled between the signal output and a reference output, wherein the signal output is coupled to an input of an amplifier of the RFFE, and the input of the amplifier has a first input impedance for the RF signal, wherein the reference output is coupled to a reference potential;

converting, during the first operating mode using the switchable capacitive element, the first output impedance of the inductive matching element to a second output impedance at an output of the switchable capacitive element, wherein the second output impedance is lower than the first output impedance; and converting, during the first operating mode using the switchable resistive element, the first input impedance of the amplifier at the signal output to the second output impedance at the output of the switchable capacitive element, and attenuating the RF signal.

16. A system comprising:

a radio frequency (RF) amplifier having an input impedance;

a switchable resistive element coupled to an input of the RF amplifier;

a switchable capacitive element having a first terminal coupled to the input of the RF amplifier and to the switchable resistive element; and an inductive element coupled between a second terminal of the switchable capacitive element and a system input, wherein:

the switchable capacitive element is configured to reduce a first impedance of the inductive element to a second impedance lower than the first impedance during a first operation mode, the switchable resistive element is configured to reduce the input impedance of the RF amplifier to a third impedance lower than the input impedance of the RF amplifier during the first operation mode, and the switchable capacitive element and the switchable resistive element are configured to provide a first attenuation to an RF signal provided at the system input during the first operation mode.

17. The system of claim 16, wherein the switchable capacitive element and the switchable resistive element are further configured to provide a second attenuation to the RF signal provided at the system input during a second operation mode, wherein the second attenuation is less than the first attenuation.

18. The system of claim 17, wherein:

the switchable capacitive element is configured as a capacitor during the first operation mode and is configured as a short circuit during the second operation mode; and the switchable resistive element has a first resistance during the first operation mode, and is an open circuit associated with a first capacitance during the second operation mode.

19. The system of claim 17, further comprising a further switchable resistive element coupled in parallel with the switchable resistive element, the further switchable resistive element configured to reduce the input impedance of the RF amplifier to a fourth impedance lower than the input impedance of the RF amplifier during a third operation mode to provide a third attenuation of the RF signal greater than the second attenuation.

20. The system of claim 16, further comprising the inductive element.

* * * * *